(12) United States Patent
Yang

(10) Patent No.: US 11,551,770 B2
(45) Date of Patent: Jan. 10, 2023

(54) ELECTRONIC DEVICES CONDUCTING A PROGRAMMING OPERATION

(71) Applicant: SK hynix Inc., Icheon-si (KR)

(72) Inventor: Myung Ho Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/244,267

(22) Filed: Apr. 29, 2021

(65) Prior Publication Data

US 2022/0148666 A1 May 12, 2022

(30) Foreign Application Priority Data

Nov. 11, 2020 (KR) .................. 10-2020-0150573

(51) Int. Cl.
*G11C 17/00* (2006.01)
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
USPC ........................................................ 365/96
See application file for complete search history.

(56) References Cited

U.S. PATENT DOCUMENTS 9,634,015 B2 4/2017 Wong et al.
2013/0258748 A1* 10/2013 Kim ...................... G11C 17/18
365/96

FOREIGN PATENT DOCUMENTS

KR 1020160074925 A 6/2016

* cited by examiner

*Primary Examiner* — Huan Hoang
(74) *Attorney, Agent, or Firm* — William Park & Associates Ltd.

(57) ABSTRACT

An electronic device includes a row control circuit and a programming circuit. The row control circuit is suitable for activating a synthesis word line selection signal for enabling a first fuse cell and a second fuse cell in a first mode. In addition, the row control circuit is suitable for activating one of a first fuse access signal for storing fuse data in the first fuse cell or outputting the fuse data from the first fuse cell and a second fuse access signal for storing the fuse data in the second fuse cell or outputting the fuse data from the second fuse cell. The programming circuit is configured to store the fuse data in one of the first and second fuse cells based on the synthesis word line selection signal and the first and second fuse access signals in the first mode.

30 Claims, 18 Drawing Sheets

FIG. 2

| TARGET FUSE CELL | RADD<1> | RADD<2> | RADD<3> | RADD<4> | PG | | SG_S | |
|---|---|---|---|---|---|---|---|---|
| | | | | | FIRST MODE (RUP:H) | SECOND MODE (BTU:H) | FIRST MODE (RUP:H) | SECOND MODE (BTU:H) |
| FC(Z-1)1 | L | L | L | L | PGZ-1:H | PGZ-1, Z:H | | SG_SZ: H |
| FCZ1 | L | L | L | H | PGZ: H | | | |
| FC11 | L | L | H | L | PG1: H | PG1, 2: H | | SG_S1: H |
| FC21 | L | L | H | H | PG2: H | | | |
| FC31 | L | H | L | L | PG3: H | PG3, 4: H | | SG_S2: H |
| FC41 | L | H | L | H | PG4: H | | | |
| FC51 | L | H | H | L | PG5: H | PG5, 6: H | | SG_S3: H |
| FC61 | L | H | H | H | PG6: H | | | |
| FC71 | H | L | L | L | PG7: H | PG7, 8: H | | SG_S4: H |
| FC81 | H | L | L | H | PG8: H | | | |
| FC91 | H | L | H | L | PG9: H | PG9, 10: H | | SG_S5: H |
| FC101 | H | L | H | H | PG10: H | | | |
| FC111 | H | H | L | L | PG11: H | PG11, 12: H | | SG_S6: H |
| FC121 | H | H | L | H | PG12: H | | | |
| FC131 | H | H | H | L | PG13: H | PG13, 14: H | | SG_S7: H |
| FC141 | H | H | H | H | PG14: H | | | |

FIG. 5

| TARGET FUSE CELL | RADD<1> | RADD<2> | RADD<3> | RADD<4> | PG_S FIRST MODE (RUP:H) | PG_S SECOND MODE (BTU:H) | SG FIRST MODE (RUP:H) | SG SECOND MODE (BTU:H) |
|---|---|---|---|---|---|---|---|---|
| FCZ-1)1 | L | L | L | L | PG_SZ:H | PG_SZ_1:H | SGZ-1:H | SGZ-1, Z:H |
| FC21 | L | L | L | H | PG_S1:H | PG_S1_2:H | SGZ:H | SG1, 2:H |
| FC11 | L | L | H | L | PG_S2:H | PG_S2_3:H | SG1:H | |
| FC21 | L | L | H | H | | | SG2:H | SG3, 4:H |
| FC31 | L | H | L | L | PG_S3:H | PG_S3_4:H | SG3:H | |
| FC41 | L | H | L | H | | | SG4:H | SG5, 6:H |
| FC51 | L | H | H | L | PG_S4:H | PG_S4_5:H | SG5:H | |
| FC61 | L | H | H | H | | | SG6:H | SG7, 8:H |
| FC71 | H | L | L | L | PG_S5:H | PG_S5_6:H | SG7:H | |
| FC81 | H | L | L | H | | | SG8:H | SG9, 10:H |
| FC91 | H | L | H | L | PG_S6:H | PG_S6_7:H | SG9:H | |
| FC101 | H | L | H | H | | | SG10:H | SG11, 12:H |
| FC111 | H | H | L | L | PG_S7:H | PG_S7_8:H | SG11:H | |
| FC121 | H | H | L | H | | | SG12:H | SG13, 14:H |
| FC131 | H | H | H | L | PG_S8:H | | SG13:H | |
| FC141 | H | H | H | H | | | SG14:H | |

FIG. 8

| TARGET FUSE CELL | RADD<1> | RADD<2> | RADD<3> | RADD<4> | PG_S | | SG_S | |
|---|---|---|---|---|---|---|---|---|
| | | | | | FIRST MODE (RUP:H) | SECOND MODE (BTU:H) | FIRST MODE (RUP:H) | SECOND MODE (BTU:H) |
| FCZ_1)1 | L | L | L | L | PG_SZ:H | PG_SZ, 1:H | | SG_SZ:H |
| FC1 | L | L | L | H | PG_S1:H | PG_S1, 2:H | SG_S1:H | |
| FC21 | L | L | H | L | PG_S2:H | | | |
| FC21 | L | L | H | H | | PG_S2, 3:H | | SG_S1:H |
| FC31 | L | H | L | L | PG_S3:H | | | |
| FC41 | L | H | L | H | | PG_S3, 4:H | | SG_S2:H |
| FC51 | L | H | H | L | PG_S5:H | | | |
| FC61 | L | H | H | H | | PG_S4, 5:H | | SG_S3:H |
| FC71 | H | L | L | L | PG_S6:H | | | |
| FC81 | H | L | L | H | | PG_S5, 6:H | | SG_S4:H |
| FC91 | H | L | H | L | PG_S7:H | | | |
| FC101 | H | L | H | H | | PG_S6, 7:H | | SG_S5:H |
| FC111 | H | H | L | L | PG_S7:H | | | |
| FC121 | H | H | L | H | | PG_S7, 8:H | | SG_S6:H |
| FC131 | H | H | H | L | PG_S8:H | | | |
| FC141 | H | H | H | H | | | | SG_S7:H |

FIG. 11

| TARGET FUSE CELL | REDUN | RADD<1> | RADD<2> | RADD<3> | PG FIRST MODE (RUP:H) | PG SECOND MODE (BTU:H) | SG_S FIRST MODE (RUP:H) | SG_S SECOND MODE (BTU:H) |
|---|---|---|---|---|---|---|---|---|
| RFCZ1 | H | L | L | L | PGZ-1:H | PGZ-1, Z:H | | SG_SZ:H |
| FCZ1 | L | L | L | L | PGZ:H | | | |
| FC11 | L | L | L | H | PG1:H | PG1, 2:H | | SG_S1:H |
| RFC11 | H | L | L | H | PG2:H | | | |
| RFC21 | H | L | H | L | PG3:H | PG3, 4:H | | SG_S2:H |
| FC21 | L | L | H | L | PG4:H | | | |
| FC31 | L | L | H | H | PG5:H | PG5, 6:H | | SG_S3:H |
| RFC31 | H | L | H | H | PG6:H | | | |
| RFC41 | H | H | L | L | PG7:H | PG7, 8:H | | SG_S4:H |
| FC41 | L | H | L | L | PG8:H | | | |
| FC51 | L | H | L | H | PG9:H | PG9, 10:H | | SG_S5:H |
| RFC51 | H | H | L | H | PG10:H | | | |
| RFC61 | H | H | H | L | PG11:H | PG11, 12:H | | SG_S6:H |
| FC61 | L | H | H | L | PG12:H | | | |
| FC71 | L | H | H | H | PG13:H | PG13, 14:H | | SG_S7:H |
| RFC71 | H | H | H | H | PG14:H | | | |

FIG. 14

| TARGET FUSE CELL | REDUN | RADD<1> | RADD<2> | RADD<3> | PG_S FIRST MODE (RUP:H) | PG_S SECOND MODE (BT:L/H) | SG FIRST MODE (RUP:H) | SG SECOND MODE (BT:L/H) |
|---|---|---|---|---|---|---|---|---|
| RFCZ1 | H | L | L | L | PG_SZ:H | PG_SZ,1:H | SGZ-1:H | SGZ-1,2:H |
| FCZ1 | L | L | L | L | PG_S1:H | PG_SZ,1:H | SGZ:H | SGZ-1,2:H |
| FC11 | L | L | L | H | PG_S1:H | PG_S1,2:H | SG1:H | SG1,2:H |
| RFC11 | H | L | L | H | PG_S2:H | PG_S1,2:H | SG2:H | SG1,2:H |
| RFC21 | H | L | H | L | PG_S2:H | PG_S2,3:H | SG3:H | SG3,4:H |
| FC21 | L | L | H | L | PG_S3:H | PG_S2,3:H | SG4:H | SG3,4:H |
| FC31 | L | L | H | H | PG_S3:H | PG_S3,4:H | SG5:H | SG5,6:H |
| RFC31 | H | L | H | H | PG_S4:H | PG_S3,4:H | SG6:H | SG5,6:H |
| RFC41 | H | H | L | L | PG_S4:H | PG_S4,5:H | SG7:H | SG7,8:H |
| FC41 | L | H | L | L | PG_S5:H | PG_S4,5:H | SG8:H | SG7,8:H |
| FC51 | L | H | L | H | PG_S5:H | PG_S5,6:H | SG9:H | SG9,10:H |
| RFC51 | H | H | L | H | PG_S6:H | PG_S5,6:H | SG10:H | SG9,10:H |
| RFC61 | H | H | H | L | PG_S6:H | PG_S6,7:H | SG11:H | SG11,12:H |
| FC61 | L | H | H | L | PG_S7:H | PG_S6,7:H | SG12:H | SG11,12:H |
| FC71 | L | H | H | H | PG_S7:H | PG_S7,8:H | SG13:H | SG13,14:H |
| RFC71 | H | H | H | H | PG_S8:H | PG_S7,8:H | SG14:H | SG13,14:H |

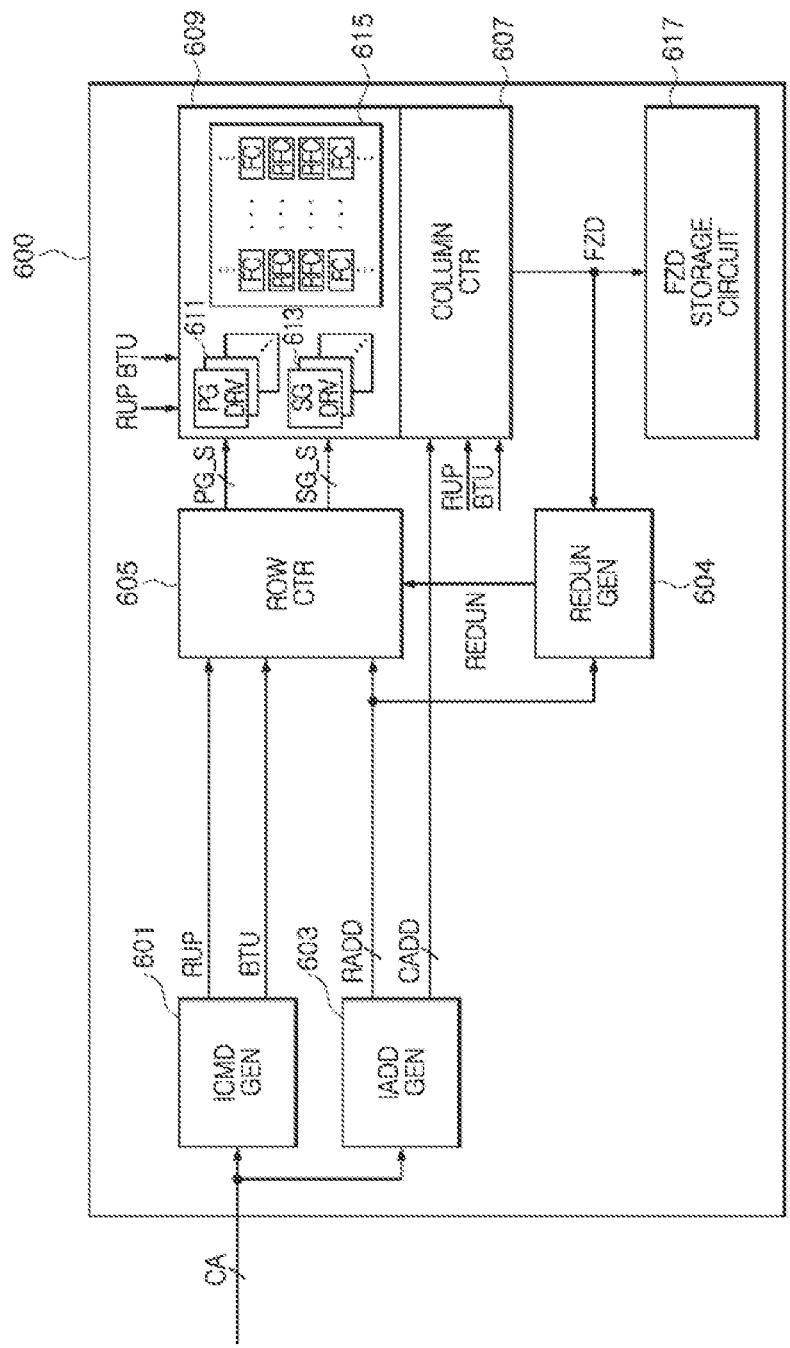

FIG. 17

| TARGET FUSE CELL | REDUN | RADD<1> | RADD<2> | RADD<3> | PG_S FIRST MODE (RUP:H) | PG_S SECOND MODE (BT:H) | SG_S FIRST MODE (RUP:H) | SG_S SECOND MODE (BT:H) |
|---|---|---|---|---|---|---|---|---|
| RFC21 | H | L | L | L | PG_S2:H | PG_S2,1:H | SG_S2:H | SG_S2:H |
| FC21 | L | L | L | L | PG_S1:H | PG_S1,2:H | | SG_S1:H |
| FC11 | L | L | L | H | PG_S2:H | PG_S2,3:H | | SG_S2:H |
| RFC11 | H | L | L | H | PG_S3:H | PG_S3,4:H | SG_S3:H | SG_S3:H |
| RFC21 | H | L | H | L | PG_S4:H | PG_S4,5:H | SG_S4:H | SG_S4:H |
| FC21 | L | L | H | L | PG_S5:H | PG_S5,6:H | | SG_S5:H |
| FC31 | L | L | H | H | PG_S6:H | PG_S6,7:H | | SG_S6:H |
| RFC31 | H | L | H | H | PG_S7:H | PG_S7,8:H | SG_S7:H | SG_S7:H |
| RFC41 | H | H | L | L | PG_S4:H | | SG_S4:H | |
| FC41 | L | H | L | L | PG_S5:H | | | |
| FC51 | L | H | L | H | PG_S6:H | | | |
| RFC51 | H | H | L | H | PG_S7:H | | SG_S7:H | |
| RFC61 | H | H | H | L | PG_S6:H | | SG_S6:H | |
| FC61 | L | H | H | L | PG_S7:H | | | |
| FC71 | L | H | H | H | PG_S8:H | | | |
| RFC71 | H | H | H | H | PG_S8:H | | SG_S8:H | |

ELECTRONIC DEVICES CONDUCTING A PROGRAMMING OPERATION

CROSS-REFERENCE TO RELATED APPLICATIONS

The present application claims priority under 35 U.S.C. 119(a) to Korean Application No. 10-2020-0150573, filed on Nov. 11, 2020, which is incorporated herein by references in its entirety.

BACKGROUND

1. Technical Field

Embodiments of the disclosed technology relate to electronic devices conducting a programming operation.

2. Related Art

Electronic devices may execute an operation for programming data into an array rupture e-fuse (ARE) in which e-fuses are arrayed. The e-fuses mean electrically programmable fuses. Recently, an area of the ARE has been continuously reduced with development of the corresponding technologies.

SUMMARY

According to an embodiment, an electronic device includes a row control circuit and a programming circuit. The row control circuit is suitable for activating a synthesis word line selection signal for enabling a first fuse cell and a second fuse cell in a first mode. In addition, the row control circuit is suitable for activating one of a first fuse access signal for storing fuse data in the first fuse cell or outputting the fuse data from the first fuse cell and a second fuse access signal for storing the fuse data in the second fuse cell or outputting the fuse data from the second fuse cell. The programming circuit is configured to store the fuse data in one of the first and second fuse cells based on the synthesis word line selection signal and the first and second fuse access signals in the first mode.

According to another embodiment, an electronic device includes a row control circuit and a programming circuit. The row control circuit is suitable for activating a first synthesis fuse access signal and a first word line selection signal for enabling a first fuse cell in a first mode or is suitable for activating a second synthesis fuse access signal and a second word line selection signal for enabling a second fuse cell in the first mode. The programming circuit is configured to store fuse data in one of the first and second fuse cells based on the first and second word line selection signals and the first and second synthesis fuse access signals in the first mode. The first synthesis fuse access signal is activated to store the fuse data in the first fuse cell and a third fuse cell or to output the fuse data from the first fuse cell and the third fuse cell. The second synthesis fuse access signal is activated to store the fuse data in the second fuse cell and a fourth fuse cell or to output the fuse data from the second fuse cell and the fourth fuse cell.

According to yet another embodiment, an electronic device includes a row control circuit and a programming circuit. The row control circuit is suitable for activating a synthesis word line selection signal for enabling a first fuse cell and a second fuse cell and one of a first synthesis fuse access signal and a second synthesis fuse access signal in a first mode. The programming circuit is configured to store fuse data in one of the first and second fuse cells based on the synthesis word line selection signal and the first and second synthesis fuse access signals in the first mode. The first synthesis fuse access signal is activated to store the fuse data in the first fuse cell and a third fuse cell or to output the fuse data from the first fuse cell and the third fuse cell. The second synthesis fuse access signal is activated to store the fuse data in the second fuse cell and a fourth fuse cell or to output the fuse data from the second fuse cell and the fourth fuse cell.

According to still another embodiment, an electronic device includes a redundancy signal generation circuit, a row control circuit, and a programming circuit. The redundancy signal generation circuit is suitable for generating a redundancy signal when a row address has a predetermined logic level combination in a first mode. The row control circuit is suitable for decoding the redundancy signal and the row address in the first mode to activate a synthesis word line selection signal for enabling a main fuse cell and a redundancy fuse cell and to activate one of a first fuse access signal and a second fuse access signal. The programming circuit is configured to store fuse data in one of the main fuse cell and the redundancy fuse cell based on the synthesis word line selection signal and the first and second fuse access signals in the first mode.

According to yet still another embodiment, an electronic device includes a redundancy signal generation circuit, a row control circuit, and a programming circuit. The redundancy signal generation circuit is suitable for generating a redundancy signal when a row address has a predetermined logic level combination in a first mode. The row control circuit decodes the redundancy signal and the row address in the first mode to activate a first synthesis fuse access signal and a first word line selection signal or to activate a second synthesis fuse access signal and a second word line selection signal. The programming circuit is configured to store fuse data in one of a main fuse cell and a redundancy fuse cell based on the first and second word line selection signals and the first and second synthesis fuse access signals in the first mode. The first synthesis fuse access signal is activated to store the fuse data in the main fuse cell and a first fuse cell or to output the fuse data from the main fuse cell and the first fuse cell. The second synthesis fuse access signal is activated to store the fuse data in the redundancy fuse cell and a second fuse cell or to output the fuse data from the redundancy fuse cell and the second fuse cell.

According to further another embodiment, an electronic device includes a redundancy signal generation circuit, a row control circuit, and a programming circuit. The redundancy signal generation circuit is suitable for generating a redundancy signal when a row address has a predetermined logic level combination in a first mode. The row control circuit is suitable for decoding the redundancy signal and the row address in the first mode to activate a synthesis word line selection signal for enabling a main fuse cell and a redundancy fuse cell and to activate one of a first synthesis fuse access signal and a second synthesis fuse access signal. The programming circuit is configured to store fuse data in one of the main fuse cell and the redundancy fuse cell based on the synthesis word line selection signal and the first and second synthesis fuse access signals in the first mode.

BRIEF DESCRIPTION OF THE DRAWINGS

FIG. 2 is a table illustrating an operation of a row control circuit included in the electronic device illustrated in FIG. 1.

FIG. 5 is a table illustrating an operation of a row control circuit included in the electronic device illustrated in FIG. 4.

FIG. 8 is a table illustrating an operation of a row control circuit included in the electronic device illustrated in FIG. 7.

FIG. 11 is a table illustrating an operation of a row control circuit included in the electronic device illustrated in FIG. 10.

FIG. 14 is a table illustrating an operation of a row control circuit included in the electronic device illustrated in FIG. 13.

FIG. 16 is a block diagram illustrating a configuration of an electronic device according to a sixth embodiment of the disclosed technology.

FIG. 17 is a table illustrating an operation of a row control circuit included in the electronic device illustrated in FIG. 16.

DETAILED DESCRIPTION OF THE EMBODIMENTS

In the following description of embodiments, when a parameter is referred to as being "predetermined," it may be intended to mean that a value of the parameter is determined in advance of when the parameter is used in a process or an algorithm. The value of the parameter may be set before or when the process or the algorithm starts or may be set during a period in which the process or the algorithm is being executed.

It will be understood that although the terms "first," "second," "third," etc. are used herein to describe various elements, these elements should not be limited by these terms. These terms are used to distinguish one element from another element and not to indicate a number or order of elements. Thus, a first element in some embodiments could be termed a second element in other embodiments without departing from the teachings of the disclosed technology, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the disclosed technology are described hereinafter in detail with reference to the accompanying drawings. However, the embodiments described herein are for illustrative purposes only and are not intended to limit the scope of the disclosed technology.

Figure 1:
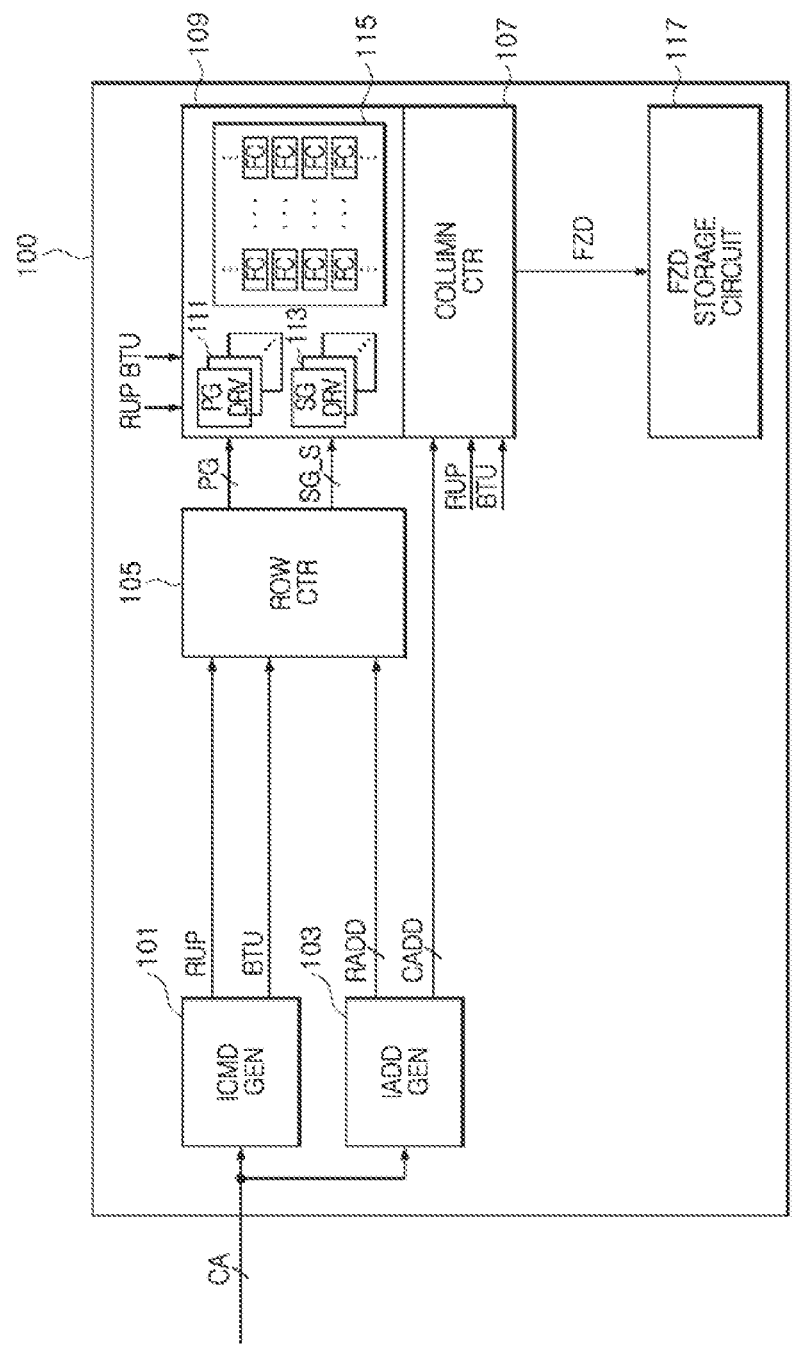
FIG. 1 is a block diagram illustrating a configuration of an electronic device according to a first embodiment of the disclosed technology.

FIG. 1 is a block diagram illustrating a configuration of an electronic device 100 according to a first embodiment of the disclosed technology. As illustrated in FIG. 1, the electronic device 100 may include an internal command generation circuit (ICMD GEN) 101, an internal address generation circuit (IADD GEN) 103, a row control circuit (ROW CTR) 105, a column control circuit (COLUMN CTR) 107, a programming circuit 109, and a fuse data storage circuit (FZD STORAGE CIRCUIT) 117. The electronic device 100 may be realized using a semiconductor device. The electronic device 100 may receive a command/address signal CA from a controller (not shown) to perform various internal operations such as a rupture operation, a boot-up operation, and so forth. The number of bits included in the command/address signal CA may be set to be different according to the embodiments.

The internal command generation circuit 101 may generate a first internal command RUP and a second internal command BTU based on the command/address signal CA. The first internal command RUP may be activated to execute a first mode. In some embodiments, the first mode may be set as an operation mode in which the rupture operation for storing fuse data FZD in one of a first fuse cell FC and a second fuse cell FC is performed. The second internal command BTU may be activated to execute a second mode. In some embodiments, the second mode may be set as an operation mode in which the boot-up operation for outputting the fuse data FZD stored in the first fuse cell FC and the second fuse cell FC is performed. The internal command generation circuit 101 may decode the command/address signal CA having a logic level combination for executing the first mode to activate the first internal command RUP. The internal command generation circuit 101 may decode the command/address signal CA having a logic level combination for executing the second mode to activate the second internal command BTU.

The internal address generation circuit 103 may generate a row address RADD and a column address CADD based on the command/address signal CA. The internal address generation circuit 103 may decode the command/address signal CA to generate the row address RADD and the column address CADD. The number of bits included in the row address RADD may be set to be different according to the embodiments. The number of bits included in the column address CADD may be set to be different according to the embodiments.

The row control circuit 105 may generate a fuse access signal PG and a synthesis word line selection signal SG_S from the row address RADD based on the first internal command RUP and the second internal command BTU. The row control circuit 105 may decode the row address RADD based on the first internal command RUP and the second internal command BTU to selectively activate the fuse access signal PG. The fuse access signal PG may include a first fuse access signal (PG1 of FIG. 2) and a second fuse access signal (PG2 of FIG. 2). The first fuse access signal PG1 may be activated to store the fuse data FZD in the first fuse cell FC and to output the fuse data FZD from the first fuse cell FC. The first fuse access signal PG1 may be activated to store the fuse data FZD in the first fuse cell FC in the first mode. The first fuse access signal PG1 may be activated to output the fuse data FZD from the first fuse cell FC in the second mode. The second fuse access signal PG2 may be activated to store the fuse data FZD in the second fuse cell FC and to output the fuse data FZD from the second fuse cell FC. The second fuse access signal PG2 may be activated to store the fuse data FZD in the second fuse cell FC in the first mode. The second fuse access signal PG2 may be activated to output the fuse data FZD from the second fuse cell FC in the second mode. The row control circuit 105 may decode the row address RADD based on the first internal command RUP and the second internal command BTU to selectively activate the synthesis word line selection signal SG_S. The synthesis word line selection signal SG_S may include a first synthesis word line selection signal (SG_S1 of FIG. 2). The first synthesis word line selection signal SG_S1 may be activated to enable the first and second fuse cells FC.

The row control circuit 105 may activate one of the first fuse access signal PG1 and the second fuse access signal PG2 according to a logic level combination of the row address RADD when the first mode is executed based on the first internal command RUP. The row control circuit 105 may activate the first synthesis word line selection signal SG_S1 according to a logic level combination of the row address RADD when the first mode is executed based on the first internal command RUP. More specifically, the row control circuit 105 may activate the first synthesis word line selection signal SG_S1 and the first fuse access signal PG1 when the row address RADD has a logic level combination corresponding to the first fuse cell FC in the first mode which is executed based on the first internal command RUP. The row control circuit 105 may activate the first synthesis word line selection signal SG_S1 and the second fuse access signal PG2 when the row address RADD has a logic level combination corresponding to the second fuse cell FC in the first mode which is executed based on the first internal command RUP.

The row control circuit 105 may activate the first synthesis word line selection signal SG_S1, the first fuse access signal PG1, and the second fuse access signal PG2 according to a logic level combination of the row address RADD when the second mode is executed based on the second internal command BTU. More specifically, the row control circuit 105 may activate the first synthesis word line selection signal SG_S1, the first fuse access signal PG1, and the second fuse access signal PG2 when the row address RADD has a logic level combination corresponding to the first fuse cell FC in the second mode which is executed based on the second internal command BTU. The row control circuit 105 may activate the first synthesis word line selection signal SG_S1, the first fuse access signal PG1, and the second fuse access signal PG2 when the row address RADD has a logic level combination corresponding to the second fuse cell FC in the second mode which is executed based on the second internal command BTU. That is, the row control circuit 105 may activate the first synthesis word line selection signal SG_S1, the first fuse access signal PG1, and the second fuse access signal PG2 when the row address RADD has a logic level combination corresponding to one of the first fuse cell FC and the second fuse cell FC in the second mode.

As described above, the row control circuit 105 may activate the synthesis word line selection signal SG_S for enabling a plurality of fuse cells FC included in the array rupture e-fuse (ARE) using a predetermined address decoding technique when the first and second modes are executed, thereby reducing an area of a selection signal driver (SG DRV) 113 for driving the synthesis word line selection signal SG_S. The operation of the row control circuit 105 will be described in more detail with reference to FIG. 2 later.

Figure 3:
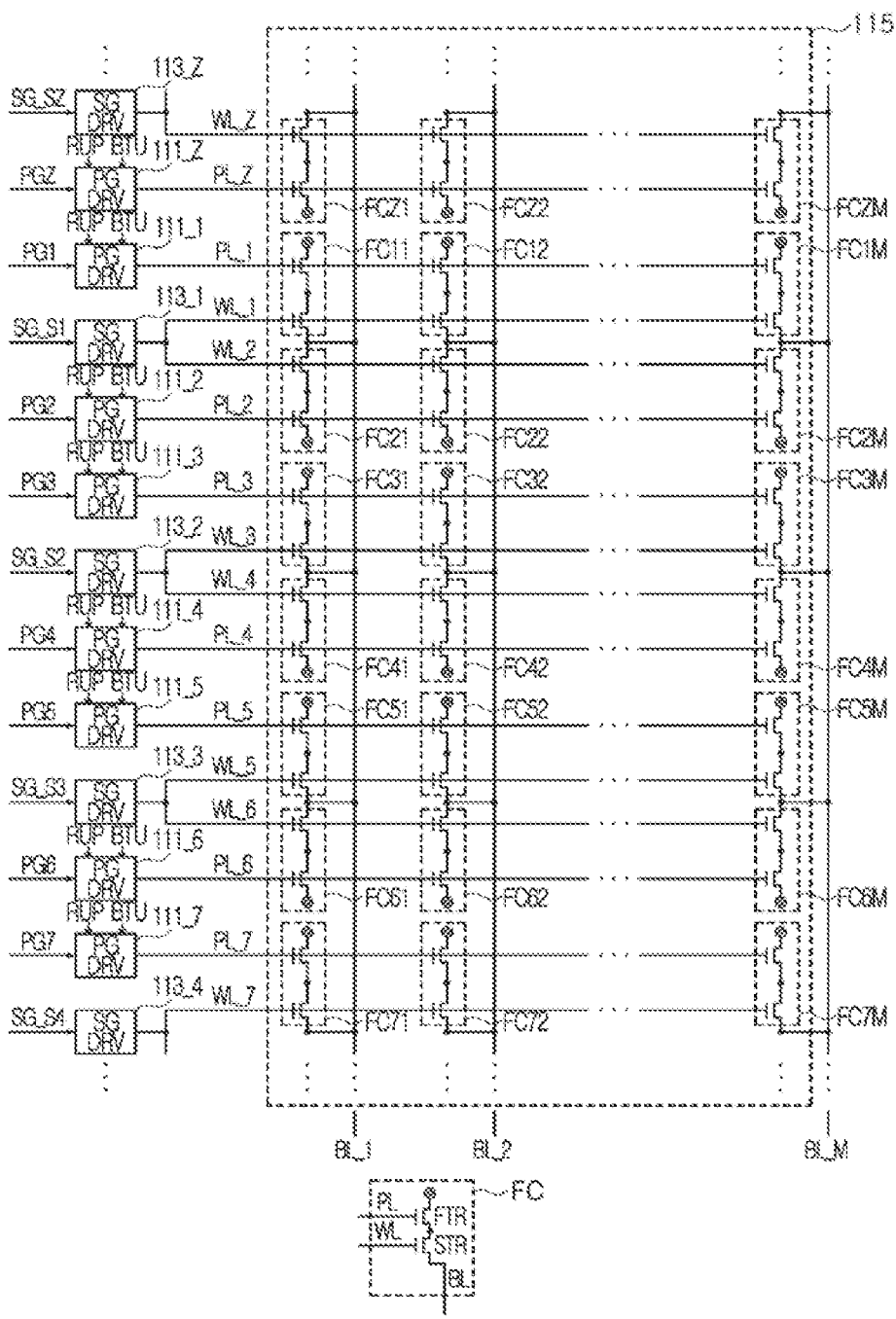
FIG. 3 illustrates an example of a programming circuit included in the electronic device illustrated in FIG. 1.

The column control circuit 107 may decode the column address CADD based on the first internal command RUP and the second internal command BTU to selectively activate at least one of bit lines (BL of FIG. 3). The column control circuit 107 may decode the column address CADD to selectively activate at least one of the bit lines (BL of FIG. 3) in the first mode that is executed based on the first internal command RUP. The column control circuit 107 may decode the column address CADD to selectively activate at least one of the bit lines (BL of FIG. 3) in the second mode that is executed based on the second internal command BTU. The column control circuit 107 may output the fuse data FZD, which are stored in the fuse cells FC, through the at least one of the bit lines (BL of FIG. 3) which is activated in the second mode that is executed based on the second internal command BTU.

The programming circuit 109 may include an access signal driver (PG DRV) 111, the selection signal driver (SG DRV) 113, and a fuse cell array 115. The programming circuit 109 may store the fuse data FZD in the fuse cells FC and may output the fuse data FZD from the fuse cells FC, based on the first internal command RUP, the second internal command BTU, the fuse access signal PG, and the synthesis word line selection signal SG_S.

The programming circuit 109 may store the fuse data FZD in the fuse cells FC in the first mode that is executed based on the first internal command RUP, the synthesis word line selection signal SG_S, and the fuse access signal PG. The programming circuit 109 may store the fuse data FZD in one of the first fuse cell FC and the second fuse cell FC based on the first synthesis word line selection signal SG_S1, the first fuse access signal PG1, and the second fuse access signal PG2 in the first mode. More specifically, the programming circuit 109 may store the fuse data FZD in the first fuse cell FC when the first synthesis word line selection signal SG_S1 and the first fuse access signal PG1 are activated in the first mode. The programming circuit 109 may store the fuse data FZD in the second fuse cell FC when the first synthesis word line selection signal SG_S1 and the second fuse access signal PG2 are activated in the first mode.

The programming circuit 109 may output the fuse data FZD, which are stored in the fuse cells, in the second mode that is executed based on the second internal command BTU, the synthesis word line selection signal SG_S, and the fuse access signal PG. The programming circuit 109 may output the fuse data FZD, which are stored in the first fuse cell, when the first synthesis word line selection signal SG_S1 and the first fuse access signal PG1 are activated in the second mode. The programming circuit 109 may output the fuse data FZD, which are stored in the second fuse cell, when the first synthesis word line selection signal SG_S1 and the second fuse access signal PG2 are activated in the second mode.

The access signal driver 111 may drive the fuse access signal PG, which is activated, based on the first internal command RUP and the second internal command BTU. The access signal driver 111 may drive the activated fuse access signal PG to a first voltage in the first mode that is executed based on the first internal command RUP. The access signal driver 111 may drive the activated fuse access signal PG to a second voltage in the second mode that is executed based on the second internal command BTU. The first voltage may be set to be higher than the second voltage.

The selection signal driver 113 may drive the activated synthesis word line selection signal SG_S to a third voltage.

The fuse cell array 115 may include a plurality of fuse cells FC. The fuse cells FC may store and output the fuse data FZD based on the driven fuse access signal PG and the driven synthesis word line selection signal SG_S. The operation of the programming circuit 109 will be described in more detail with reference to FIG. 3 later.

The fuse data storage circuit 117 may store the fuse data FZD.

FIG. 2 is a table illustrating an operation of the row control circuit 105 included in the electronic device 100 illustrated in FIG. 1. Referring to FIG. 2, the first mode may be executed when the first internal command RUP has a logic "high(H)" level. The second mode may be executed when the second internal command BTU has a logic "high (H)" level. A target fuse cell may correspond to a fuse cell (FC of FIG. 1) which is selected by a logic level combination of the row address RADD and a logic level combination of the column address (CADD of FIG. 1). In FIG. 2, an operation that the target fuse cell is selected by a logic level combination of the column address CADD will be omitted. A fuse cell FC11 may be set as the target fuse cell when the row address RADD<1:4> has a logic level combination of 'L, L, H, L'. A fuse cell FC21 may be set as the target fuse cell when the row address RADD<1:4> has a logic level combination of 'L, L, H, H'.

The row control circuit 105 may generate the first fuse access signal PG1 and the first synthesis word line selection signal SG_S1 which are activated to have a logic "high(H)" level when a logic level combination of the row address RADD<1:4> designates the fuse cell FC11 in the first mode. The first fuse access signal PG1 may be activated to store the fuse data (FZD of FIG. 1) in the fuse cell FC11 in the first mode. The first synthesis word line selection signal SG_S1 may be activated to enable the fuse cell FC11 and the fuse cell FC21. Thus, the fuse data (FZD of FIG. 1) may be stored in the fuse cell FC11 when a logic level combination of the row address RADD<1:4> designates the fuse cell FC11 in the first mode.

The row control circuit 105 may generate the first fuse access signal PG1, the second fuse access signal PG2, and the first synthesis word line selection signal SG_S1 which are activated to have a logic "high(H)" level when a logic level combination of the row address RADD<1:4> designates the fuse cell FC11 in the second mode. The first fuse access signal PG1 may be activated to output the fuse data (FZD of FIG. 1), which are stored in the fuse cell FC11, in the second mode. The second fuse access signal PG2 may be activated to output the fuse data (FZD of FIG. 1), which are stored in the fuse cell FC21, in the second mode. Thus, the fuse data (FZD of FIG. 1) may be outputted from the fuse cells FC11 and FC21 when a logic level combination of the row address RADD<1:4> designates the fuse cell FC11 in the second mode.

The row control circuit 105 may generate the second fuse access signal PG2 and the first synthesis word line selection signal SG_S1 which are activated to have a logic "high(H)" level when a logic level combination of the row address RADD<1:4> designates the fuse cell FC21 in the first mode. The second fuse access signal PG2 may be activated to store the fuse data (FZD of FIG. 1) in the fuse cell FC21 in the first mode. Thus, the fuse data (FZD of FIG. 1) may be stored in the fuse cell FC21 when a logic level combination of the row address RADD<1:4> designates the fuse cell FC21 in the first mode.

The row control circuit 105 may generate the first fuse access signal PG1, the second fuse access signal PG2, and the first synthesis word line selection signal SG_S1 which are activated to have a logic "high(H)" level when a logic level combination of the row address RADD<1:4> designates the fuse cell FC21 in the second mode. Thus, the fuse data (FZD of FIG. 1) may be outputted from the fuse cell FC11 and the fuse cell FC21 when a logic level combination of the row address RADD<1:4> designates the fuse cell FC21 in the second mode.

FIG. 3 illustrates an example of the programming circuit 109 included in the electronic device 100 illustrated in FIG. 1. As illustrated in FIG. 3, the programming circuit 109 may include a plurality of access signal drivers (PG DRV) 111_Z and 111_1~111_7, a plurality of selection signal drivers (SG DRV) 113_Z and 113_1~113_4, the fuse cell array 115, a plurality of word lines WL_Z and WL_1~WL_7, a plurality of program lines PL_Z and PL_1~PL_7, and a plurality of bit lines BL_1~BL_M.

The access signal driver 111_1 may drive the first fuse access signal PG1, which is activated, based on the first internal command RUP and the second internal command BTU. The access signal driver 111_1 may drive the activated first fuse access signal PG1 to the first voltage in the first mode that is executed based on the first internal command RUP. The access signal driver 111_1 may drive the activated first fuse access signal PG1 to the second voltage in the second mode that is executed based on the second internal command BTU. The access signal driver 1111 may output the driven first fuse access signal PG1 to the program line PL_1.

The access signal driver 111_2 may drive the second fuse access signal PG2, which is activated, based on the first internal command RUP and the second internal command BTU. The access signal driver 111_2 may drive the activated second fuse access signal PG2 to the first voltage in the first mode that is executed based on the first internal command RUP. The access signal driver 1112 may drive the activated second fuse access signal PG2 to the second voltage in the second mode that is executed based on the second internal command BTU. The access signal driver 111_2 may output the driven second fuse access signal PG2 to the program line PL_2.

The selection signal driver 113_1 may drive the first synthesis word line selection signal SG_S1, which is activated, to the third voltage. The selection signal driver 113_1 may output the driven first synthesis word line selection signal SG_S1 to the word lines WL_1 and WL_2.

The fuse cell array 115 may include the plurality of fuse cells FC. Each of the plurality of fuse cells FC may include a fuse transistor FTR and a selection transistor STR. A first terminal (e.g., a source terminal) of the fuse transistor FTR may be isolated by an isolation layer to be electrically floated. A second terminal (e.g., a drain terminal) of the fuse transistor FTR may be electrically connected to a first terminal (e.g., a source terminal) of the selection transistor STR such that the fuse transistor FTR and the selection transistor STR are coupled in series. A third terminal (e.g., a gate terminal) of the fuse transistor FTR may be electrically connected to any one of the program lines PL. A second terminal (e.g., a drain terminal) of the selection transistor STR may be electrically connected to any one of the bit lines BL. A third terminal (e.g., a gate terminal) of the selection transistor STR may be electrically connected to any one of the word lines WL.

The fuse cell FC11 may include a first fuse transistor FTR and a first selection transistor STR. The first fuse transistor FTR of the fuse cell FC11 may store or output the fuse data (FZD of FIG. 1) based on the first fuse access signal PG1 which is driven by the access signal driver 111_1. The first selection transistor STR of the fuse cell FC11 may be turned on based on the first synthesis word line selection signal SG_S1 which is driven by the selection signal driver 113_1. The first fuse transistor FTR and the first selection transistor STR of the fuse cell FC11 may be coupled in series. The first selection transistor STR of the fuse cell FC11 may be turned on when the bit line BL_1 is activated and the first synthesis word line selection signal SG_S1, which is driven to have the third voltage, is inputted to a gate terminal of the first selection transistor STR through the word line WL_1. The first fuse transistor FTR of the fuse cell FC11 may store the fuse data (FZD of FIG. 1) when the first selection transistor STR is turned on and the first fuse access signal PG1, which is driven to have the first voltage, is inputted to a gate terminal of the first fuse transistor FTR through the program line PL_1 in the first mode. The first fuse transistor FTR of the fuse cell FC11 may be programmed to store the fuse data (FZD of FIG. 1) by rupturing a gate dielectric layer of the first fuse transistor FTR by applying the first fuse access signal PG1, which is driven to have the first voltage, to the gate terminal of the first fuse transistor FTR. The first fuse transistor FTR of the fuse cell FC11 may output the fuse data (FZD of FIG. 1) to the bit line BL_1 when the first selection transistor STR is turned on and the first fuse access signal PG1, which is driven to have the second voltage, is inputted to the gate terminal of the first fuse transistor FTR through the program line PL_1 in the second mode.

The fuse cell FC21 may include a second fuse transistor FTR and a second selection transistor STR. The second fuse transistor FTR of the fuse cell FC21 may store or output the fuse data (FZD of FIG. 1) based on the second fuse access signal PG2 which is driven by the access signal driver 111_2. The second selection transistor STR of the fuse cell FC21 may be turned on based on the first synthesis word line selection signal SG_S1 which is driven by the selection signal driver 113_1. The second fuse transistor FTR and the second selection transistor STR of the fuse cell FC21 may be coupled in series. The fuse cell FC21 may share the bit line BL_1 with the fuse cell FC11, and the fuse cell FC21 and the fuse cell FC11 may be coupled in parallel to the bit line BL_1. More specifically, the first selection transistor STR of the fuse cell FC11 and the second selection transistor STR of the fuse cell FC21 may be coupled in parallel to the bit line BL_1 to share the bit line BL_1 with each. The second selection transistor STR of the fuse cell FC21 may be turned on when the bit line BL_1 is activated and the first synthesis word line selection signal SG_S1, which is driven to have the third voltage, is inputted to a gate terminal of the second selection transistor STR through the word line WL_2. The second fuse transistor FTR of the fuse cell FC21 may store the fuse data (FZD of FIG. 1) when the second selection transistor STR is turned on and the second fuse access signal PG2, which is driven to have the first voltage, is inputted to a gate terminal of the second fuse transistor FTR through the program line PL_2 in the first mode. The second fuse transistor FTR of the fuse cell FC21 may be programmed to store the fuse data (FZD of FIG. 1) by rupturing a gate dielectric layer of the second fuse transistor FTR by applying the second fuse access signal PG2, which is driven to have the first voltage, to the gate terminal of the second fuse transistor FTR. The second fuse transistor FTR of the fuse cell FC21 may output the fuse data (FZD of FIG. 1) to the bit line BL_1 when the second selection transistor STR is turned on and the second fuse access signal PG2, which is driven to have the second voltage, is inputted to the gate terminal of the second fuse transistor FTR through the program line PL_2 in the second mode.

Figure 4:
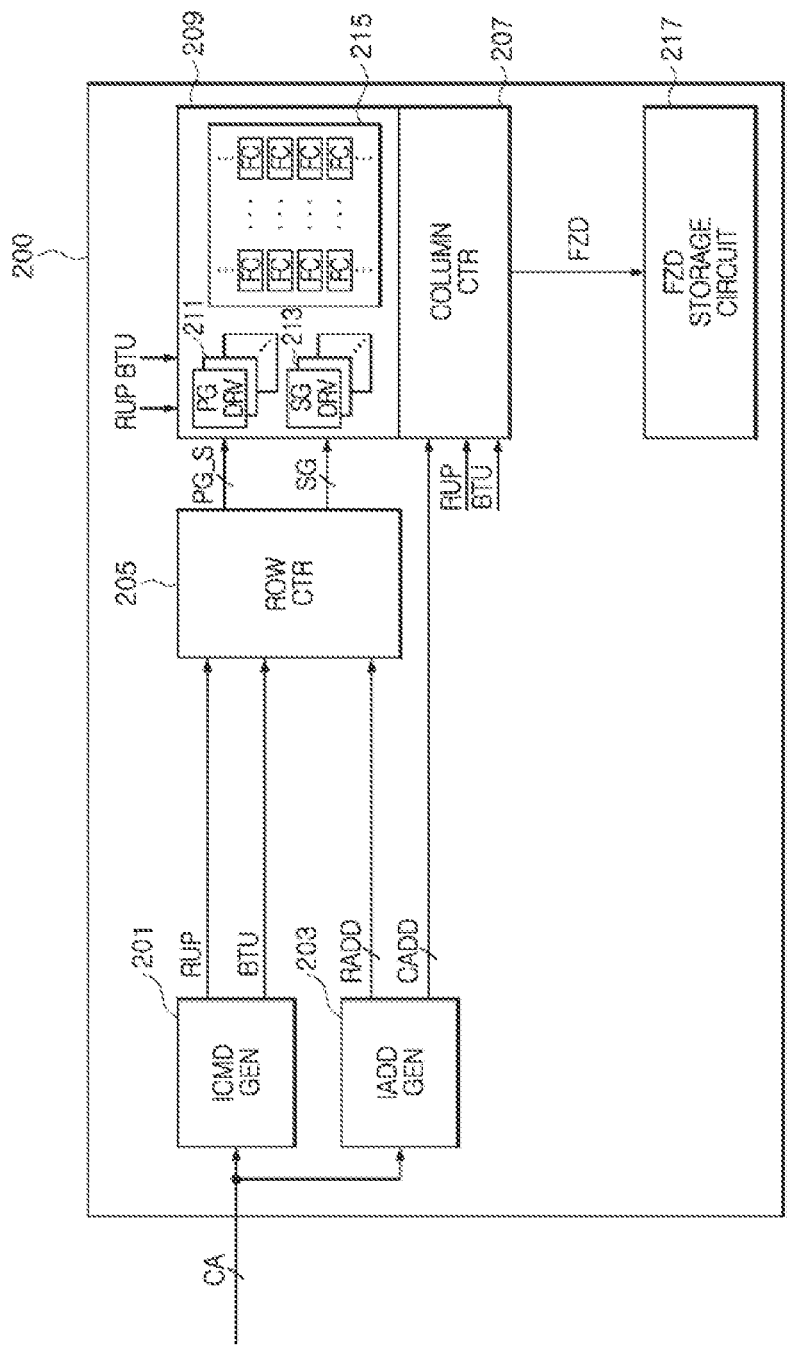
FIG. 4 is a block diagram illustrating a configuration of an electronic device according to a second embodiment of the disclosed technology.

FIG. 4 is a block diagram illustrating a configuration of an electronic device 200 according to a second embodiment of the disclosed technology. As illustrated in FIG. 4, the electronic device 200 may include an internal command generation circuit (ICMD GEN) 201, an internal address generation circuit (IADD GEN) 203, a row control circuit (ROW CTR) 205, a column control circuit (COLUMN CTR) 207, a programming circuit 209, and a fuse data storage circuit (FZD STORAGE CIRCUIT) 217. The electronic device 200 may be realized using a semiconductor device. The electronic device 200 may receive a command/address signal CA from a controller (not shown) to perform various internal operations such as a rupture operation, a boot-up operation, and so forth. The number of bits included in the command/address signal CA may be set to be different according to the embodiments.

The internal command generation circuit 201 may generate a first internal command RUP and a second internal command BTU based on the command/address signal CA. The first internal command RUP may be activated to execute a first mode. In some embodiments, the first mode may be set as an operation mode in which the rupture operation for storing fuse data FZD in one of a first fuse cell FC and a second fuse cell FC is performed. The second internal command BTU may be activated to execute a second mode. In some embodiments, the second mode may be set as an operation mode in which the boot-up operation for outputting the fuse data FZD stored in the first fuse cell FC and the second fuse cell FC is performed. The internal command generation circuit 201 may be realized to perform the same operation as the internal command generation circuit 101 described with reference to FIG. 1. Thus, detailed descriptions of the internal command generation circuit 201 will be omitted hereinafter.

The internal address generation circuit 203 may generate a row address RADD and a column address CADD based on the command/address signal CA. The internal address generation circuit 203 may be realized to perform the same operation as the internal address generation circuit 103 described with reference to FIG. 1. Thus, detailed descriptions of the internal address generation circuit 203 will be omitted hereinafter.

The row control circuit 205 may generate a synthesis fuse access signal PG_S and a word line selection signal SG from the row address RADD based on the first internal command RUP and the second internal command BTU. The row control circuit 205 may decode the row address RADD based on the first internal command RUP and the second internal command BTU to selectively activate the synthesis fuse access signal PG_S. The synthesis fuse access signal PG_S may include a first synthesis fuse access signal (PG_S1 of FIG. 5) and a second synthesis fuse access signal (PG_S2 of FIG. 5). The first synthesis fuse access signal PG_S1 may be activated to store the fuse data FZD in the first fuse cell FC and a third fuse cell FC and to output the fuse data FZD from the first fuse cell FC and the third fuse cell FC. The first synthesis fuse access signal PG_S1 may be activated to store the fuse data FZD in the first fuse cell FC and the third fuse cell FC in the first mode. The first synthesis fuse access signal PG_S1 may be activated to output the fuse data FZD from the first fuse cell FC and the third fuse cell FC in the second mode. The second synthesis fuse access signal PG_S2 may be activated to store the fuse data FZD in the second fuse cell FC and a fourth fuse cell FC and to output the fuse data FZD from the second fuse cell FC and the fourth fuse cell FC. The second synthesis fuse access signal PG_S2 may be activated to store the fuse data FZD in the second fuse cell FC and the fourth fuse cell FC in the first mode. The second synthesis fuse access signal PG_S2 may be activated to output the fuse data FZD from the second fuse cell FC and the fourth fuse cell FC in the second mode. The row control circuit 205 may decode the row address RADD based on the first internal command RUP and the second internal command BTU to selectively activate the word line selection signal SG. The word line selection signal SG may include a first word line selection signal (SG1 of FIG. 5) and a second word line selection signal (SG2 of FIG. 5). The first word line selection signal SG1 may be activated to enable the first fuse cell FC. The second word line selection signal SG2 may be activated to enable the second fuse cell FC.

The row control circuit 205 may activate the first word line selection signal SG1 and the first synthesis fuse access signal PG_S1 or the second word line selection signal SG2 and the second synthesis fuse access signal PG_S2 according to a logic level combination of the row address RADD when the first mode is executed based on the first internal command RUP. More specifically, the row control circuit 205 may activate the first word line selection signal SG1 and the first synthesis fuse access signal PG_S1 when the row address RADD has a logic level combination corresponding to the first fuse cell FC in the first mode that is executed based on the first internal command RUP. The row control circuit 205 may activate the second word line selection signal SG2 and the second synthesis fuse access signal PG_S2 when the row address RADD has a logic level combination corresponding to the second fuse cell FC in the first mode that is executed based on the first internal command RUP. The row control circuit 205 may activate the first synthesis fuse access signal PG_S1 when the row address RADD has a logic level combination corresponding to the third fuse cell FC in the first mode that is executed based on the first internal command RUP. The row control circuit 205 may activate the second synthesis fuse access signal PG_S2 when the row address RADD has a logic level combination corresponding to the fourth fuse cell FC in the first mode that is executed based on the first internal command RUP.

The row control circuit 205 may activate the first word line selection signal SG1, the second word line selection signal SG2, the first synthesis fuse access signal PG_S1, and the second synthesis fuse access signal PG_S2 when the second mode is executed based on the second internal command BTU. More specifically, the row control circuit 205 may activate the first word line selection signal SG1, the second word line selection signal SG2, the first synthesis fuse access signal PG_S1, and the second synthesis fuse access signal PG_S2 when the row address RADD has a logic level combination corresponding to the first fuse cell FC in the second mode which is executed based on the second internal command BTU. The row control circuit 205 may activate the first word line selection signal SG1, the second word line selection signal SG2, the first synthesis fuse access signal PG_S1, and the second synthesis fuse access signal PG_S2 when the row address RADD has a logic level combination corresponding to the second fuse cell FC in the second mode which is executed based on the second internal command BTU. That is, the row control circuit 205 may activate the first word line selection signal SG1, the second word line selection signal SG2, the first synthesis fuse access signal PG_S1, and the second synthesis fuse access signal PG_S2 when the row address RADD has a logic level combination corresponding to one of the first fuse cell FC and the second fuse cell FC in the second mode which is executed based on the second internal command BTU.

As described above, the row control circuit 205 may activate the synthesis fuse access signal PG_S for storing the fuse data FZD in a plurality of fuse cells FC included in the array rupture e-fuse (ARE) and for outputting the fuse data FZD from the plurality of fuse cells FC included in the array rupture e-fuse (ARE) using a predetermined address decoding technique when the first and second modes are executed, thereby reducing an area of an access signal driver (PG DRV) 211 for driving the synthesis fuse access signal PG_S. The operation of the row control circuit 205 will be described in more detail with reference to FIG. 5 later.

Figure 6:
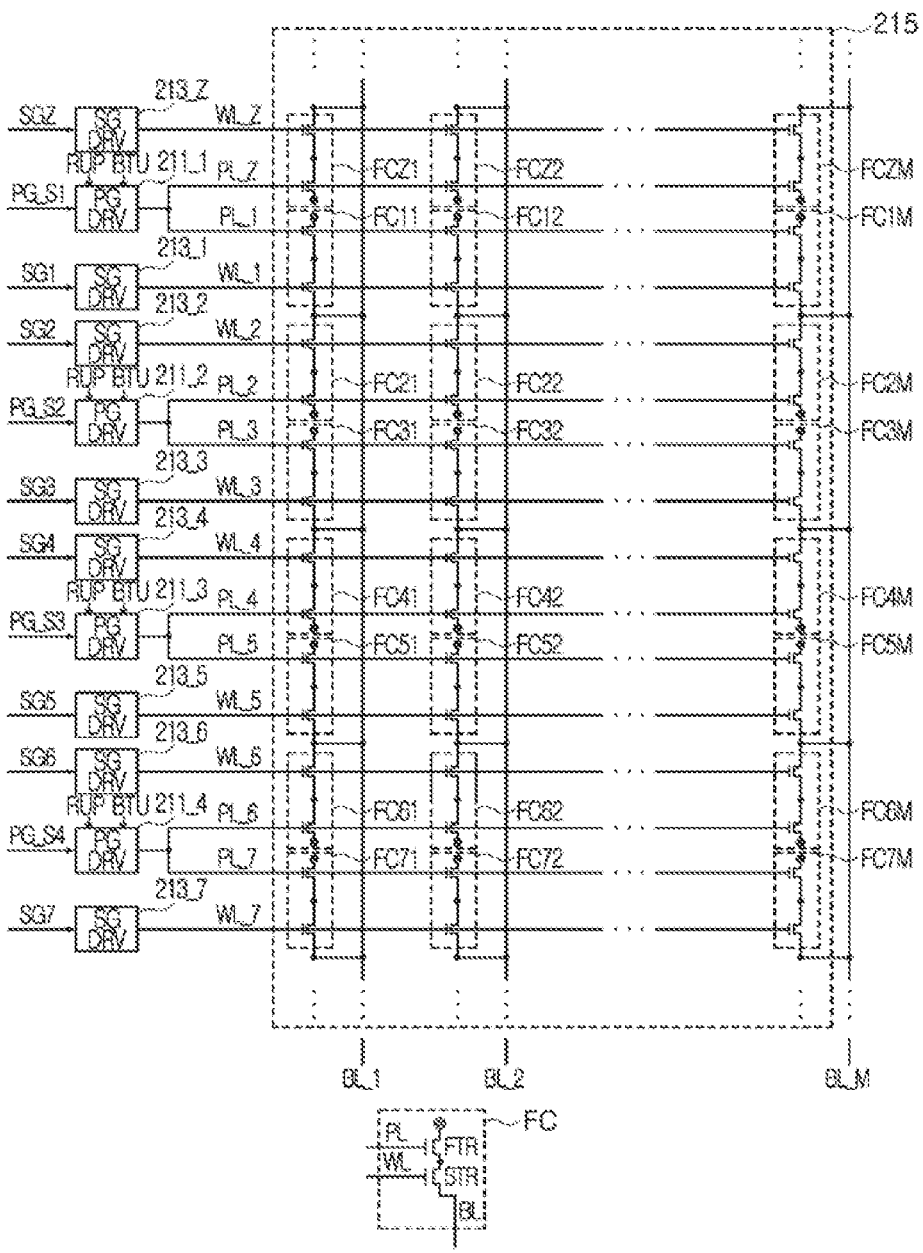
FIG. 6 illustrates an example of a programming circuit included in the electronic device illustrated in FIG. 4.

The column control circuit 207 may decode the column address CADD based on the first internal command RUP and the second internal command BTU to selectively activate at least one of bit lines (BL of FIG. 6). The column control circuit 207 may be realized to perform the same operation as the column control circuit 107 described with reference to FIG. 1. Thus, detailed descriptions of the column control circuit 207 will be omitted hereinafter.

The programming circuit 209 may include the access signal driver (PG DRV) 211, a selection signal driver (SG DRV) 213, and a fuse cell array 215. The programming circuit 209 may store the fuse data FZD in the fuse cells FC and may output the fuse data FZD from the fuse cells FC, based on the first internal command RUP, the second internal command BTU, the synthesis fuse access signal PG_S, and the word line selection signal SG.

The programming circuit 209 may store the fuse data FZD in the fuse cells FC in the first mode that is executed based on the first internal command RUP, the word line selection signal SG, and the synthesis fuse access signal PG_S. The programming circuit 209 may store the fuse data FZD in one of the first fuse cell FC and the second fuse cell FC based on the first word line selection signal SG1, the second word line selection signal SG2, the first synthesis fuse access signal PG_S1, and the second synthesis fuse access signal PG_S2 in the first mode. More specifically, the programming circuit 209 may store the fuse data FZD in the first fuse cell FC when the first word line selection signal SG1 and the first synthesis fuse access signal PG_S1 are activated in the first mode. The programming circuit 209 may store the fuse data FZD in the second fuse cell FC when the second word line selection signal SG2 and the second synthesis fuse access signal PG_S2 are activated in the first mode.

The programming circuit 209 may output the fuse data FZD, which are stored in the fuse cells, in the second mode that is executed based on the second internal command BTU, the word line selection signal SG, and the synthesis fuse access signal PG_S. The programming circuit 209 may output the fuse data FZD, which are stored in the first fuse cell and the second fuse cell, based on the second internal command BTU, the first and second word line selection signals SG1 and SG2, and the first and second synthesis fuse access signals PG_S1 and PG_S2 in the second mode. More specifically, the programming circuit 209 may output the fuse data FZD, which are stored in the first fuse cell, when the first word line selection signal SG1 and the first synthesis fuse access signal PG_S1 are activated in the second mode. In addition, the programming circuit 209 may output the fuse data FZD, which are stored in the second fuse cell, when the second word line selection signal SG2 and the second synthesis fuse access signal PG_S2 are activated in the second mode.

The access signal driver 211 may drive the synthesis fuse access signal PG_S, which is activated, based on the first internal command RUP and the second internal command BTU. The access signal driver 211 may drive the activated synthesis fuse access signal PG_S to a first voltage in the first mode that is executed based on the first internal command RUP. The access signal driver 211 may drive the activated synthesis fuse access signal PG_S to a second voltage in the second mode that is executed based on the second internal command BTU. The first voltage may be set to be higher than the second voltage.

The selection signal driver 213 may drive the activated word line selection signal SG to a third voltage.

The fuse cell array 215 may include a plurality of fuse cells FC. The fuse cells FC may store and output the fuse data FZD based on the driven synthesis fuse access signal PG_S and the driven word line selection signal SG. The operation of the programming circuit 209 will be described in more detail with reference to FIG. 6 later.

The fuse data storage circuit 217 may store the fuse data FZD.

FIG. 5 is a table illustrating an operation of the row control circuit 205 included in the electronic device 200 illustrated in FIG. 4. Referring to FIG. 5, the first mode, the second mode, and a target fuse cell indicated in the present embodiment may be defined to have substantially the same meanings as the first mode, the second mode, and the target fuse cell described with reference to FIG. 2. Thus, detailed descriptions of the first mode, the second mode, and the target fuse cell indicated in the present embodiment will be omitted hereinafter.

The row control circuit 205 may generate the first synthesis fuse access signal PG_S1 and the first word line selection signal SG1 which are activated to have a logic "high(H)" level when a logic level combination of the row address RADD<1:4> designates the fuse cell FC11 in the first mode. The first synthesis fuse access signal PG_S1 may be activated to store the fuse data (FZD of FIG. 4) in a fuse cell FCZ1 and the fuse cell FC11 in the first mode. The first word line selection signal SG1 may be activated to enable the fuse cell FC11. Thus, the fuse data (FZD of FIG. 4) may be stored in the fuse cell FC11 when a logic level combination of the row address RADD<1:4> designates the fuse cell FC11 in the first mode.

The row control circuit 205 may generate the first synthesis fuse access signal PG_S1, the second synthesis fuse access signal PG_S2, the first word line selection signal SG1, and the second word line selection signal SG2 which are activated to have a logic "high(H)" level when a logic level combination of the row address RADD<1:4> designates the fuse cell FC11 in the second mode. The first synthesis fuse access signal PG_S1 may be activated to output the fuse data (FZD of FIG. 4), which are stored in the fuse cell FCZ1 and the fuse cell FC11, in the second mode. The second synthesis fuse access signal PG_S2 may be activated to output the fuse data (FZD of FIG. 4), which are stored in the fuse cell FC21 and the fuse cell FC31, in the second mode. The second word line selection signal SG2 may be activated to enable the fuse cell FC21. Thus, the fuse data (FZD of FIG. 4) may be outputted from the fuse cells FC11 and FC21 when a logic level combination of the row address RADD<1:4> designates the fuse cell FC11 in the second mode.

The row control circuit 205 may generate the second synthesis fuse access signal PG_S2 and the second word line selection signal SG2 which are activated to have a logic "high(H)" level when a logic level combination of the row address RADD<1:4> designates the fuse cell FC21 in the first mode. The second synthesis fuse access signal PG_S2 may be activated to store the fuse data (FZD of FIG. 4) in the fuse cell FC21 and the fuse cell FC31 in the first mode. Thus, the fuse data (FZD of FIG. 4) may be stored in the fuse cell FC21 when a logic level combination of the row address RADD<1:4> designates the fuse cell FC21 in the first mode.

The row control circuit 205 may generate the first synthesis fuse access signal PG_S1, the second synthesis fuse access signal PG_S2, the first word line selection signal SG1, and the second word line selection signal SG2 which are activated to have a logic "high(H)" level when a logic level combination of the row address RADD<1:4> designates the fuse cell FC21 in the second mode. Thus, the fuse data (FZD of FIG. 4) may be outputted from the fuse cell FC11 and the fuse cell FC21 when a logic level combination of the row address RADD<1:4> designates the fuse cell FC21 in the second mode.

FIG. 6 illustrates an example of the programming circuit 209 included in the electronic device 200 illustrated in FIG. 4. As illustrated in FIG. 6, the programming circuit 209 may include a plurality of access signal drivers (PG DRV) 211_1~211_4, a plurality of selection signal drivers (SG DRV) 213_Z and 213_1~213_7, the fuse cell array 215, a plurality of word lines WL_Z and WL_1~WL_7, a plurality of program lines PL_Z and PL_1~PL_7, and a plurality of bit lines BL_1~BL_M.

The access signal driver 211_1 may drive the first synthesis fuse access signal PG_S1, which is activated, based on the first internal command RUP and the second internal command BTU. The access signal driver 211_1 may drive the activated first synthesis fuse access signal PG_S1 to the first voltage in the first mode that is executed based on the first internal command RUP. The access signal driver 211_1 may drive the activated first synthesis fuse access signal PG_S1 to the second voltage in the second mode that is executed based on the second internal command BTU. The access signal driver 211_1 may output the driven first synthesis fuse access signal PG_S1 to the program line PL_Z and the program line PL_1.

The access signal driver 211_2 may drive the second synthesis fuse access signal PG_S2, which is activated, based on the first internal command RUP and the second internal command BTU. The access signal driver 211_2 may drive the activated second synthesis fuse access signal PG_S2 to the first voltage in the first mode that is executed based on the first internal command RUP. The access signal driver 211_2 may drive the activated second synthesis fuse access signal PG_S2 to the second voltage in the second mode that is executed based on the second internal command BTU. The access signal driver 211_2 may output the driven second synthesis fuse access signal PG_S2 to the program line PL_2 and the program line PL_3.

The selection signal driver 213_1 may drive the first word line selection signal SG1, which is activated, to the third voltage. The selection signal driver 213_1 may output the driven first word line selection signal SG1 to the word line WL_1.

The selection signal driver 213_2 may drive the second word line selection signal SG2, which is activated, to the third voltage. The selection signal driver 213_2 may output the driven second word line selection signal SG2 to the word line WL_2.

The fuse cell array 215 may include the plurality of fuse cells FC. Each of the plurality of fuse cells FC may include a fuse transistor FTR and a selection transistor STR. Each fuse cell FC (including the fuse transistor FTR and the selection transistor STR) illustrated in the present embodiment may have the same configuration as each fuse cell FC described with reference to FIG. 3. Thus, the detailed configuration of the fuse cell FC illustrated in the present embodiment will be omitted hereinafter.

The fuse cell FC11 may include a first fuse transistor FTR and a first selection transistor STR. The first fuse transistor FTR of the fuse cell FC11 may store or output the fuse data (FZD of FIG. 4) based on the first synthesis fuse access signal PG_S1 which is driven by the access signal driver 211_1. The first selection transistor STR of the fuse cell FC11 may be turned on based on the first word line selection signal SG1 which is driven by the selection signal driver 213_1. The first fuse transistor FTR and the first selection transistor STR of the fuse cell FC11 may be coupled in series. The first selection transistor STR of the fuse cell FC11 may be turned on when the bit line BL_1 is activated and the first word line selection signal SG1, which is driven to have the third voltage, is inputted to a gate terminal of the first selection transistor STR through the word line WL_1. The first fuse transistor FTR of the fuse cell FC11 may store the fuse data (FZD of FIG. 4) when the first selection transistor STR is turned on and the first synthesis fuse access signal PG_S1, which is driven to have the first voltage, is inputted to a gate terminal of the first fuse transistor FTR through the program line PL_1 in the first mode. The first fuse transistor FTR of the fuse cell FC11 may be programmed to store the fuse data (FZD of FIG. 4) by rupturing a gate dielectric layer of the first fuse transistor FTR by applying the first synthesis fuse access signal PG_S1, which is driven to have the first voltage, to the gate terminal of the first fuse transistor FTR. The first fuse transistor FTR of the fuse cell FC11 may output the fuse data (FZD of FIG. 4) to the bit line BL_1 when the first selection transistor STR is turned on and the first synthesis fuse access signal PG_S1, which is driven to have the second voltage, is inputted to the gate terminal of the first fuse transistor FTR through the program line PL_1 in the second mode.

The fuse cell FC21 may include a second fuse transistor FTR and a second selection transistor STR. The second fuse transistor FTR of the fuse cell FC21 may store or output the fuse data (FZD of FIG. 4) based on the second synthesis fuse access signal PG_S2 which is driven by the access signal driver 211_2. The second selection transistor STR of the fuse cell FC21 may be turned on based on the second word line selection signal SG2 which is driven by the selection signal driver 213_2. The second fuse transistor FTR and the second selection transistor STR of the fuse cell FC21 may be coupled in series. The fuse cell FC21 may share the bit line BL_1 with the fuse cell FC11, and the fuse cell FC21 and the fuse cell FC11 may be coupled in parallel to the bit line BL_1. More specifically, the first selection transistor STR of the fuse cell FC11 and the second selection transistor STR of the fuse cell FC21 may be coupled in parallel to the bit line BL_1 to share the bit line BL_1 with each. The second selection transistor STR of the fuse cell FC21 may be turned on when the bit line BL_1 is activated and the second word line selection signal SG2, which is driven to have the third voltage, is inputted to a gate terminal of the second selection transistor STR through the word line WL_2. The second fuse transistor FTR of the fuse cell FC21 may store the fuse data (FZD of FIG. 4) when the second selection transistor STR is turned on and the second synthesis fuse access signal PG_S2, which is driven to have the first voltage, is inputted to a gate terminal of the second fuse transistor FTR through the program line PL_2 in the first mode. The second fuse transistor FTR of the fuse cell FC21 may be programmed to store the fuse data (FZD of FIG. 4) by rupturing a gate dielectric layer of the second fuse transistor FTR by applying the second synthesis fuse access signal PG_S2, which is driven to have the first voltage, to the gate terminal of the second fuse transistor FTR. The second fuse transistor FTR of the fuse cell FC21 may output the fuse data (FZD of FIG. 4) to the bit line BL_1 when the second selection transistor STR is turned on and the second synthesis fuse access signal PG_S2, which is driven to have the second voltage, is inputted to the gate terminal of the second fuse transistor FTR through the program line PL_2 in the second mode.

Figure 7:
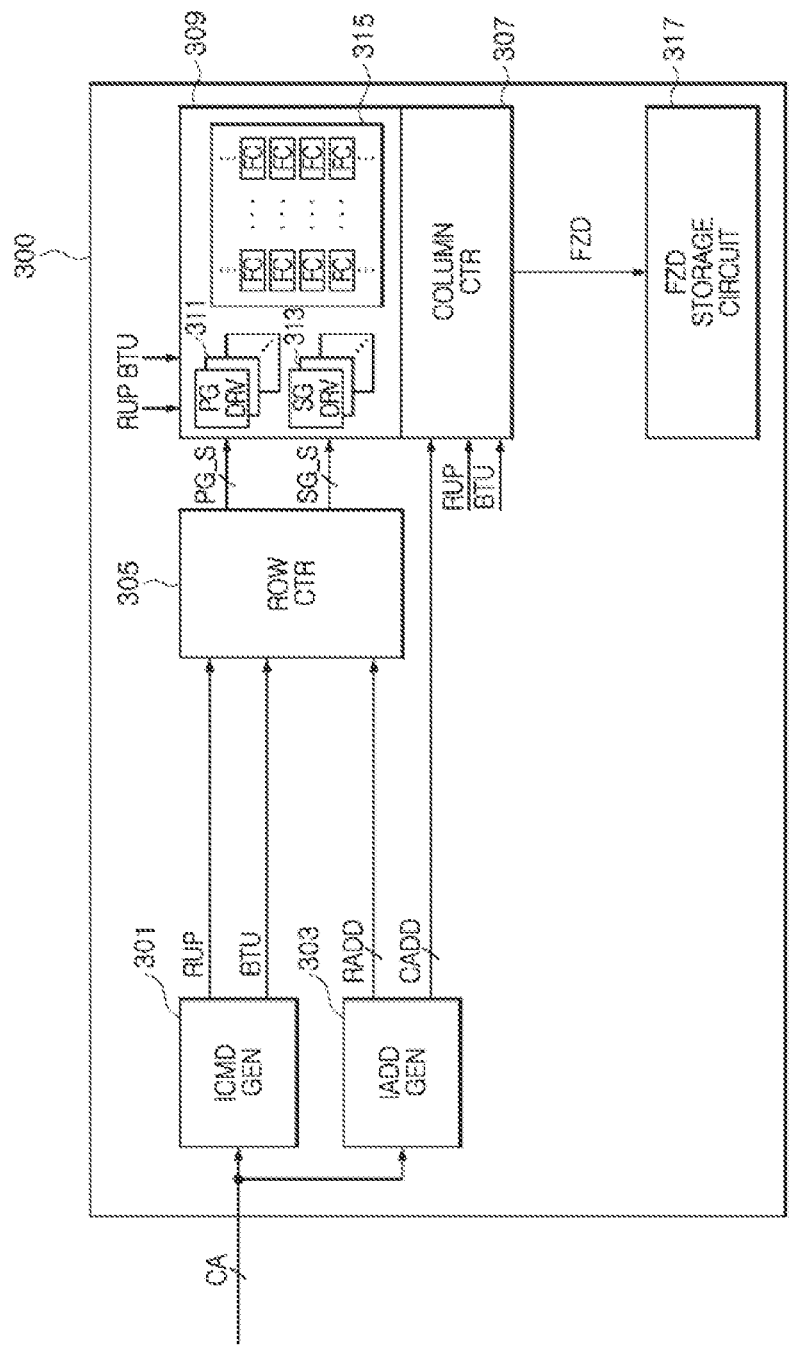
FIG. 7 is a block diagram illustrating a configuration of an electronic device according to a third embodiment of the disclosed technology.

FIG. 7 is a block diagram illustrating a configuration of an electronic device 300 according to a third embodiment of the disclosed technology. As illustrated in FIG. 7, the electronic device 300 may include an internal command generation circuit (ICMD GEN) 301, an internal address generation circuit (IADD GEN) 303, a row control circuit (ROW CTR) 305, a column control circuit (COLUMN CTR) 307, a programming circuit 309, and a fuse data storage circuit (FZD STORAGE CIRCUIT) 317. The electronic device 300 may be realized using a semiconductor device. The electronic device 300 may receive a command/address signal CA from a controller (not shown) to perform various internal operations such as a rupture operation, a boot-up operation, and so forth. The number of bits included in the command/address signal CA may be set to be different according to the embodiments.

The internal command generation circuit 301 may generate a first internal command RUP and a second internal command BTU based on the command/address signal CA. The first internal command RUP may be activated to execute a first mode. In some embodiments, the first mode may be set as an operation mode in which the rupture operation for storing fuse data FZD in one of a first fuse cell FC and a second fuse cell FC is performed. The second internal command BTU may be activated to execute a second mode. In some embodiments, the second mode may be set as an operation mode in which the boot-up operation for outputting the fuse data FZD stored in the first fuse cell FC and the second fuse cell FC is performed. The internal command generation circuit 301 may be realized to perform the same operation as the internal command generation circuit 101 described with reference to FIG. 1. Thus, detailed descriptions of the internal command generation circuit 301 will be omitted hereinafter.

The internal address generation circuit 303 may generate a row address RADD and a column address CADD based on the command/address signal CA. The internal address generation circuit 303 may be realized to perform the same operation as the internal address generation circuit 103 described with reference to FIG. 1. Thus, detailed descriptions of the internal address generation circuit 303 will be omitted hereinafter.

The row control circuit 305 may generate a synthesis fuse access signal PG_S and a synthesis word line selection signal SG_S from the row address RADD based on the first internal command RUP and the second internal command BTU. The row control circuit 305 may decode the row address RADD based on the first internal command RUP and the second internal command BTU to selectively activate the synthesis fuse access signal PG_S. The synthesis fuse access signal PG_S may include a first synthesis fuse access signal (PG_S1 of FIG. 8) and a second synthesis fuse access signal (PG_S2 of FIG. 8). The first synthesis fuse access signal PG_S1 may be activated to store the fuse data FZD in the first fuse cell FC and a third fuse cell FC and to output the fuse data FZD from the first fuse cell FC and the third fuse cell FC. The first synthesis fuse access signal PG_S1 may be activated to store the fuse data FZD in the first fuse cell FC and the third fuse cell FC in the first mode. The first synthesis fuse access signal PG_S1 may be activated to output the fuse data FZD from the first fuse cell FC and the third fuse cell FC in the second mode. The second synthesis fuse access signal PG_S2 may be activated to store the fuse data FZD in the second fuse cell FC and a fourth fuse cell FC and to output the fuse data FZD from the second fuse cell FC and the fourth fuse cell FC. The second synthesis fuse access signal PG_S2 may be activated to store the fuse data FZD in the second fuse cell FC and the fourth fuse cell FC in the first mode. The second synthesis fuse access signal PG_S2 may be activated to output the fuse data FZD from the second fuse cell FC and the fourth fuse cell FC in the second mode. The row control circuit 305 may decode the row address RADD based on the first internal command RUP and the second internal command BTU to selectively activate the synthesis word line selection signal SG_S. The synthesis word line selection signal SG_S may include a first synthesis word line selection signal (SG_S1 of FIG. 8). The first synthesis word line selection signal SG_S1 may be activated to enable the first fuse cell FC and the second fuse cell FC.

The row control circuit 305 may activate one of the first synthesis fuse access signal PG_S1 and the second synthesis fuse access signal PG_S2 according to a logic level combination of the row address RADD when the first mode is executed based on the first internal command RUP. The row control circuit 305 may activate the first synthesis fuse access signal PG_S1 according to a logic level combination of the row address RADD in the first mode that is executed based on the first internal command RUP. More specifically, the row control circuit 305 may activate the first synthesis word line selection signal SG_S1 and the first synthesis fuse access signal PG_S1 when the row address RADD has a logic level combination corresponding to the first fuse cell FC in the first mode that is executed based on the first internal command RUP. The row control circuit 305 may activate the first synthesis word line selection signal SG_S1 and the second synthesis fuse access signal PG_S2 when the row address RADD has a logic level combination corresponding to the second fuse cell FC in the first mode that is executed based on the first internal command RUP. The row control circuit 305 may activate the first synthesis fuse access signal PG_S1 when the row address RADD has a logic level combination corresponding to the third fuse cell FC in the first mode that is executed based on the first internal command RUP. The row control circuit 305 may activate the second synthesis fuse access signal PG_S2 when the row address RADD has a logic level combination corresponding to the fourth fuse cell FC in the first mode that is executed based on the first internal command RUP.

The row control circuit 305 may activate the first synthesis word line selection signal SG_S1, the first synthesis fuse access signal PG_S1, and the second synthesis fuse access signal PG_S2 according to a logic level combination of the row address RADD when the second mode is executed based on the second internal command BTU. More specifically, the row control circuit 305 may activate the first synthesis word line selection signal SG_S1, the first synthesis fuse access signal PG_S1, and the second synthesis fuse access signal PG_S2 when the row address RADD has a logic level combination corresponding to the first fuse cell FC in the second mode that is executed based on the second internal command BTU. The row control circuit 305 may activate the first synthesis word line selection signal SG_S1, the first synthesis fuse access signal PG_S1, and the second synthesis fuse access signal PG_S2 when the row address RADD has a logic level combination corresponding to the second fuse cell FC in the second mode that is executed based on the second internal command BTU. That is, the row control circuit 305 may activate the first synthesis word line selection signal SG_S1, the first synthesis fuse access signal PG_S1, and the second synthesis fuse access signal PG_S2 when the row address RADD has a logic level combination corresponding to one of the first fuse cell FC and the second fuse cell FC in the second mode that is executed based on the second internal command BTU.

As described above, the row control circuit 305 may activate the synthesis fuse access signal PG_S for storing the fuse data FZD in a plurality of fuse cells FC included in the array rupture e-fuse (ARE) and for outputting the fuse data FZD from the plurality of fuse cells FC included in the array rupture e-fuse (ARE) using a predetermined address decoding technique when the first and second modes are executed, thereby reducing an area of an access signal driver (PG DRV) 311 for driving the synthesis fuse access signal PG_S. In addition, the row control circuit 305 may activate the synthesis word line selection signal SG_S for enabling the plurality of fuse cells FC included in the array rupture e-fuse (ARE) using a predetermined address decoding technique when the first and second modes are executed, thereby reducing an area of a selection signal driver (SG DRV) 313 for driving the synthesis word line selection signal SG_S.

Figure 9:
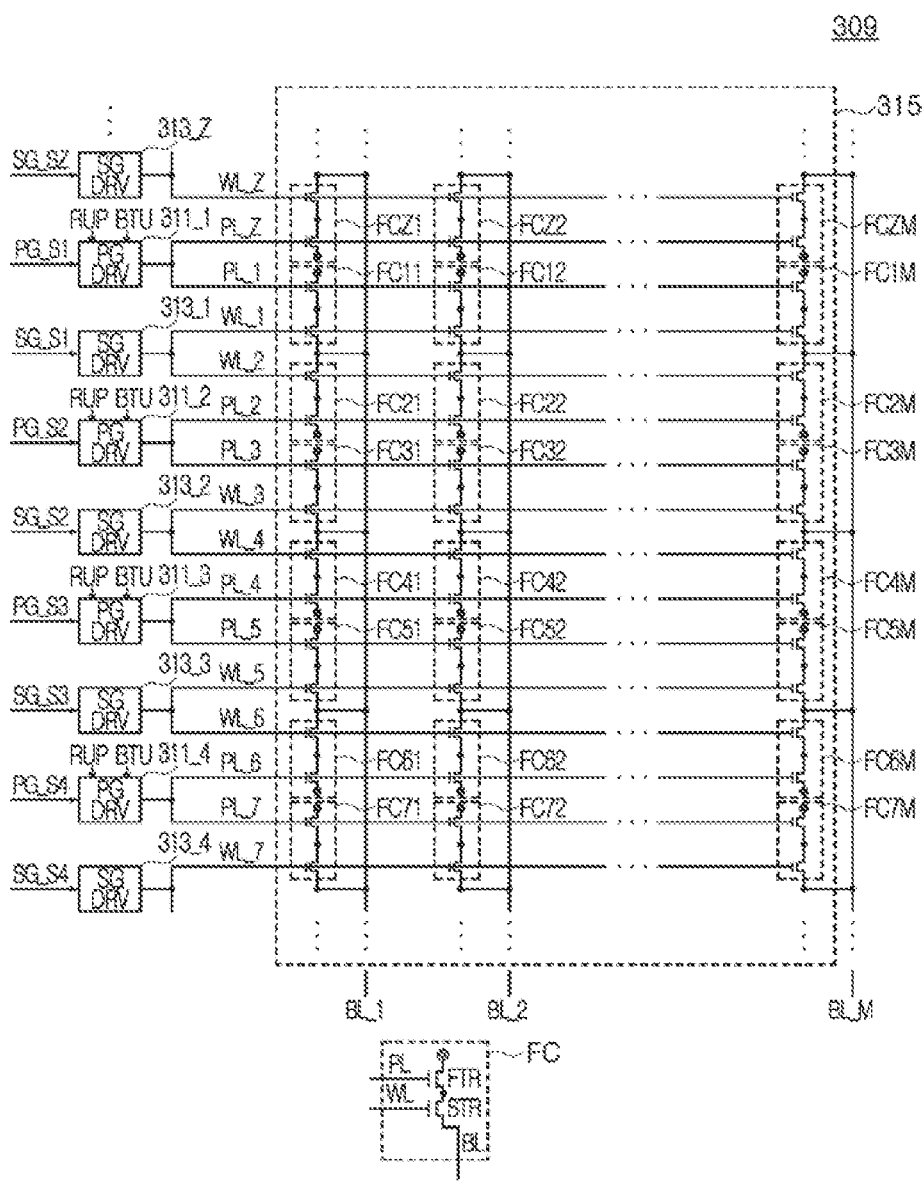
FIG. 9 illustrates an example of a programming circuit included in the electronic device illustrated in FIG. 7.

The column control circuit 307 may decode the column address CADD based on the first internal command RUP and the second internal command BTU to selectively activate at least one of bit lines (BL of FIG. 9). The column control circuit 307 may be realized to perform the same operation as the column control circuit 107 described with reference to FIG. 1. Thus, detailed descriptions of the column control circuit 307 will be omitted hereinafter.

The programming circuit 309 may include the access signal driver (PG DRV) 311, the selection signal driver (SG DRV) 313, and a fuse cell array 315. The programming circuit 309 may store the fuse data FZD in the fuse cells FC and may output the fuse data FZD from the fuse cells FC, based on the first internal command RUP, the second internal command BTU, the synthesis fuse access signal PG_S, and the synthesis word line selection signal SG_S.

The programming circuit 309 may store the fuse data FZD in the fuse cells FC in the first mode that is executed based on the first internal command RUP, the synthesis word line selection signal SG_S, and the synthesis fuse access signal PG_S. The programming circuit 309 may store the fuse data FZD in one of the first fuse cell FC and the second fuse cell FC in the first mode that is executed based on the first internal command RUP, the first synthesis word line selection signal SG_S1, the first synthesis fuse access signal PG_S1, and the second synthesis fuse access signal PG_S2. More specifically, the programming circuit 309 may store the fuse data FZD in the first fuse cell FC based on the first synthesis word line selection signal SG_S1 and the first synthesis fuse access signal PG_S1 in the first mode. The programming circuit 309 may store the fuse data FZD in the second fuse cell FC based on the first synthesis word line selection signal SG_S1 and the second synthesis fuse access signal PG_S2 in the first mode.

The programming circuit 309 may output the fuse data FZD, which are stored in the fuse cells FC, in the second mode that is executed based on the second internal command BTU, the synthesis word line selection signal SG_S, and the synthesis fuse access signal PG_S. The programming circuit 309 may output the fuse data FZD, which are stored in the first fuse cell FC and the second fuse cell FC, in the second mode that is executed based on the second internal command BTU, the first synthesis word line selection signal SG_S1, the first synthesis fuse access signal PG_S1, and the second synthesis fuse access signal PG_S2. More specifically, the programming circuit 309 may output the fuse data FZD, which are stored in the first fuse cell FC, when the first synthesis word line selection signal SG_S1 and the first synthesis fuse access signal PG_S1 are activated in the second mode. The programming circuit 309 may output the fuse data FZD, which are stored in the second fuse cell FC, when the first synthesis word line selection signal SG_S1 and the second synthesis fuse access signal PG_S2 are activated in the second mode.

The access signal driver 311 may drive the synthesis fuse access signal PG_S based on the first internal command RUP and the second internal command BTU. The access signal driver 311 may be realized to perform the same operation as the access signal driver 211 illustrated in FIG. 4. Thus, detailed descriptions of the access signal driver 311 will be omitted hereinafter.

The selection signal driver 313 may drive the synthesis word line selection signal SG_S to a third voltage. The selection signal driver 313 may be realized to perform the same operation as the selection signal driver 113 illustrated in FIG. 1. Thus, detailed descriptions of the selection signal driver 313 will be omitted hereinafter.

The fuse cell array 315 may include a plurality of fuse cells FC. The fuse cells FC may store and output the fuse data FZD based on the driven synthesis fuse access signal PG_S and the driven synthesis word line selection signal SG_S. The operation of the programming circuit 309 will be described in more detail with reference to FIG. 9 later.

The fuse data storage circuit 317 may store the fuse data FZD.

FIG. 8 is a table illustrating an operation of the row control circuit 305 included in the electronic device 300 illustrated in FIG. 7. Referring to FIG. 8, the first mode, the second mode, and a target fuse cell indicated in the present embodiment may be defined to have substantially the same meanings as the first mode, the second mode, and the target fuse cell described with reference to FIG. 2. Thus, detailed descriptions of the first mode, the second mode, and the target fuse cell indicated in the present embodiment will be omitted hereinafter.

The row control circuit 305 may generate the first synthesis fuse access signal PG_S1 and the first synthesis word line selection signal SG_S1 which are activated to have a logic "high(H)" level when a logic level combination of the row address RADD<1:4> designates a fuse cell FC11 in the first mode. The first synthesis fuse access signal PG_S1 may be activated to store the fuse data (FZD of FIG. 7) in a fuse cell FCZ1 and the fuse cell FC11 in the first mode. The first synthesis word line selection signal SG_S1 may be activated to enable the fuse cell FC11 and a fuse cell FC21. Thus, the fuse data (FZD of FIG. 7) may be stored in the fuse cell FC11 when a logic level combination of the row address RADD<1:4> designates the fuse cell FC11 in the first mode.

The row control circuit 305 may generate the first synthesis fuse access signal PG_S1, the second synthesis fuse access signal PG_S2, and the first synthesis word line selection signal SG_S1 which are activated to have a logic "high(H)" level when a logic level combination of the row address RADD<1:4> designates the fuse cell FC11 in the second mode. The first synthesis fuse access signal PG_S1 may be activated to output the fuse data (FZD of FIG. 7), which are stored in the fuse cell FCZ1 and the fuse cell FC11, in the second mode. The second synthesis fuse access signal PG_S2 may be activated to output the fuse data (FZD of FIG. 7), which are stored in the fuse cell FC21 and a fuse cell FC31, in the second mode. Thus, the fuse data (FZD of FIG. 7) may be outputted from the fuse cells FC11 and FC21 when a logic level combination of the row address RADD<1:4> designates the fuse cell FC11 in the second mode.

The row control circuit 305 may generate the second synthesis fuse access signal PG_S2 and the first synthesis word line selection signal SG_S1 which are activated to have a logic "high(H)" level when a logic level combination of the row address RADD<1:4> designates the fuse cell FC21 in the first mode. The second synthesis fuse access signal PG_S2 may be activated to store the fuse data (FZD of FIG. 7) in the fuse cell FC21 and the fuse cell FC31 in the first mode. Thus, the fuse data (FZD of FIG. 7) may be stored in the fuse cell FC21 when a logic level combination of the row address RADD<1:4> designates the fuse cell FC21 in the first mode.

The row control circuit 305 may generate the first synthesis fuse access signal PG_S1, the second synthesis fuse access signal PG_S2, and the first synthesis word line selection signal SG_S1 which are activated to have a logic "high(H)" level when a logic level combination of the row address RADD<1:4> designates the fuse cell FC21 in the second mode. Thus, the fuse data (FZD of FIG. 7) may be outputted from the fuse cell FC11 and the fuse cell FC21 when a logic level combination of the row address RADD<1:4> designates the fuse cell FC21 in the second mode.

FIG. 9 illustrates an example of the programming circuit 309 included in the electronic device 300 illustrated in FIG. 7. As illustrated in FIG. 9, the programming circuit 309 may include a plurality of access signal drivers (PG DRV) 311_1~311_4, a plurality of selection signal drivers (SG DRV) 313_Z and 313_1~313_4, the fuse cell array 315, a plurality of word lines WL_Z and WL_1~WL_7, a plurality of program lines PL_Z and PL_1~PL_7, and a plurality of bit lines BL_1~BL_M.

The access signal driver 311_1 may drive the first synthesis fuse access signal PG_S1 based on the first internal command RUP and the second internal command BTU. The access signal driver 311_1 may be realized to perform the same operation as the access signal driver 211_1 illustrated in FIG. 6. Thus, detailed descriptions of the access signal driver 311_1 will be omitted hereinafter.

The access signal driver 311_2 may drive the second synthesis fuse access signal PG_S2 based on the first internal command RUP and the second internal command BTU. The access signal driver 311_2 may be realized to perform the same operation as the access signal driver 211_2 illustrated in FIG. 6. Thus, detailed descriptions of the access signal driver 311_2 will be omitted hereinafter.

The selection signal driver 313_1 may drive the first synthesis word line selection signal SG_S1 to the third voltage. The selection signal driver 313_1 may be realized to perform the same operation as the selection signal driver 113_1 illustrated in FIG. 3. Thus, detailed descriptions of the selection signal driver 313_1 will be omitted hereinafter.

The fuse cell array 315 may include the plurality of fuse cells FC. Each of the plurality of fuse cells FC may include a fuse transistor FTR and a selection transistor STR. Each fuse cell FC (including the fuse transistor FTR and the selection transistor STR) illustrated in the present embodiment may have the same configuration as each fuse cell FC described with reference to FIG. 3. Thus, the detailed configuration of the fuse cell FC illustrated in the present embodiment will be omitted hereinafter.

The fuse cell FC11 may include a first fuse transistor FTR and a first selection transistor STR. The first fuse transistor FTR of the fuse cell FC11 may store or output the fuse data (FZD of FIG. 7) based on the first synthesis fuse access signal PG_S1 which is driven by the access signal driver 311_1. The first selection transistor STR of the fuse cell FC11 may be turned on based on the first synthesis word line selection signal SG_S1 which is driven by the selection signal driver 313_1. The first fuse transistor FTR and the first selection transistor STR of the fuse cell FC11 may be coupled in series. The first selection transistor STR of the fuse cell FC11 may be turned on when the bit line BL_1 is activated and the first synthesis word line selection signal SG_S1, which is driven to have the third voltage, is inputted to a gate terminal of the first selection transistor STR through the word line WL_1. The first fuse transistor FTR of the fuse cell FC11 may store the fuse data (FZD of FIG. 7) when the first selection transistor STR is turned on and the first synthesis fuse access signal PG_S1, which is driven to have the first voltage, is inputted to a gate terminal of the first fuse transistor FTR through the program line PL_1 in the first mode. The first fuse transistor FTR of the fuse cell FC11 may be programmed to store the fuse data (FZD of FIG. 7) by rupturing a gate dielectric layer of the first fuse transistor FTR by applying the first synthesis fuse access signal PG_S1, which is driven to have the first voltage, to the gate terminal of the first fuse transistor FTR. The first fuse transistor FTR of the fuse cell FC11 may output the fuse data (FZD of FIG. 7) to the bit line BL_1 when the first selection transistor STR is turned on and the first synthesis fuse access signal PG_S1, which is driven to have the second voltage, is inputted to the gate terminal of the first fuse transistor FTR through the program line PL_1 in the second mode.

The fuse cell FC21 may include a second fuse transistor FTR and a second selection transistor STR. The second fuse transistor FTR of the fuse cell FC21 may store or output the fuse data (FZD of FIG. 7) based on the second synthesis fuse access signal PG_S2 which is driven by the access signal driver 311_2. The second selection transistor STR of the fuse cell FC21 may be turned on based on the first synthesis word line selection signal SG_S1 which is driven by the selection signal driver 313_1. The second fuse transistor FTR and the second selection transistor STR of the fuse cell FC21 may be coupled in series. The fuse cell FC21 may share the bit line BL_1 with the fuse cell FC11, and the fuse cell FC21 and the fuse cell FC11 may be coupled in parallel to the bit line BL_1. More specifically, the first selection transistor STR of the fuse cell FC11 and the second selection transistor STR of the fuse cell FC21 may be coupled in parallel to the bit line BL_1 to share the bit line BL_1 with each. The second selection transistor STR of the fuse cell FC21 may be turned on when the bit line BL_1 is activated and the first synthesis word line selection signal SG_S1, which is driven to have the third voltage, is inputted to a gate terminal of the second selection transistor STR through the word line WL_2. The second fuse transistor FTR of the fuse cell FC21 may store the fuse data (FZD of FIG. 7) when the second selection transistor STR is turned on and the second synthesis fuse access signal PG_S2, which is driven to have the first voltage, is inputted to a gate terminal of the second fuse transistor FTR through the program line PL_2 in the first mode. The second fuse transistor FTR of the fuse cell FC21 may be programmed to store the fuse data (FZD of FIG. 7) by rupturing a gate dielectric layer of the second fuse transistor FTR by applying the second synthesis fuse access signal PG_S2, which is driven to have the first voltage, to the gate terminal of the second fuse transistor FTR. The second fuse transistor FTR of the fuse cell FC21 may output the fuse data (FZD of FIG. 7) to the bit line BL_1 when the second selection transistor STR is turned on and the second synthesis fuse access signal PG_S2, which is driven to have the second voltage, is inputted to the gate terminal of the second fuse transistor FTR through the program line PL_2 in the second mode.

Figure 10:
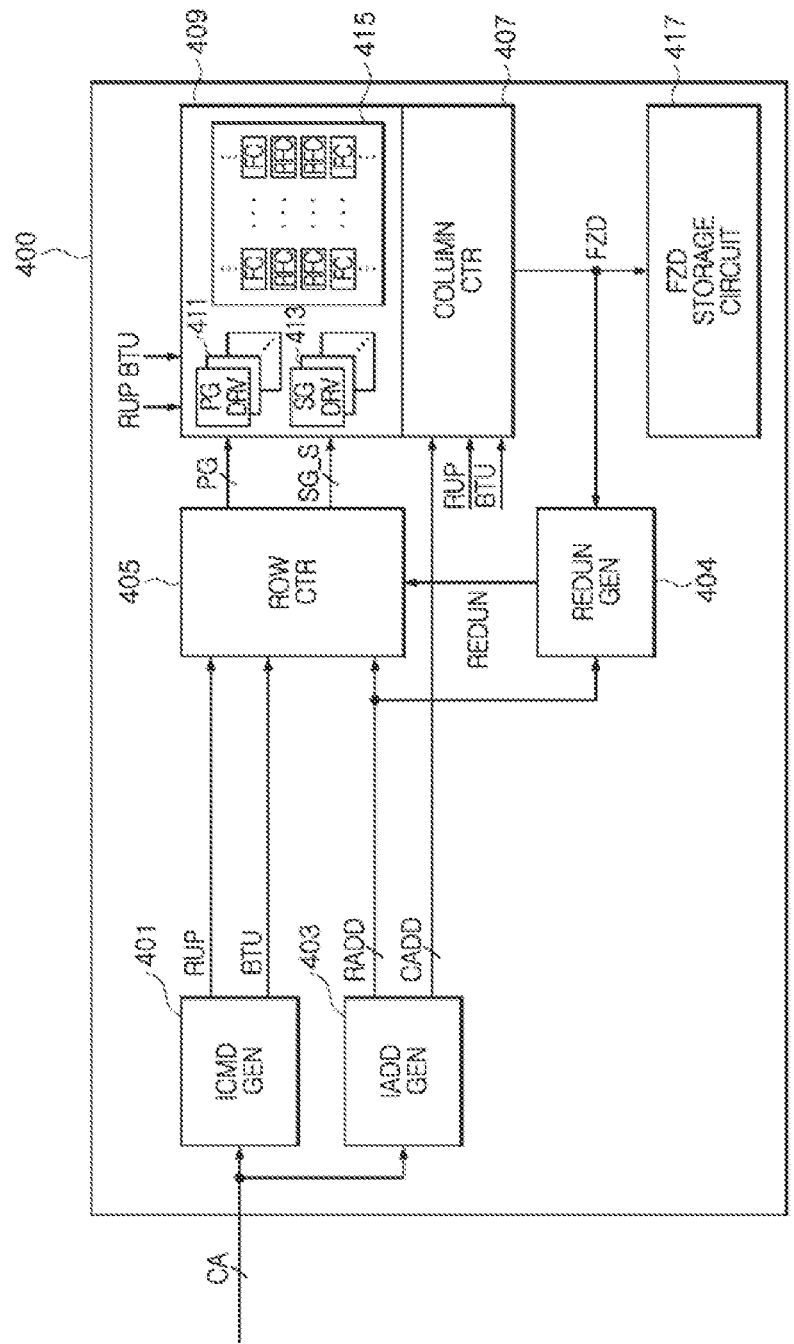
FIG. 10 is a block diagram illustrating a configuration of an electronic device according to a fourth embodiment of the disclosed technology.

FIG. 10 is a block diagram illustrating a configuration of an electronic device 400 according to a fourth embodiment of the disclosed technology. As illustrated in FIG. 10, the electronic device 400 may include an internal command generation circuit (ICMD GEN) 401, an internal address generation circuit (IADD GEN) 403, a redundancy signal generation circuit (REDUN GEN) 404, a row control circuit (ROW CTR) 405, a column control circuit (COLUMN CTR) 407, a programming circuit 409, and a fuse data storage circuit (FZD STORAGE CIRCUIT) 417. The electronic device 400 may be realized using a semiconductor device. The electronic device 400 may receive a command/address signal CA from a controller (not shown) to perform various internal operations such as a rupture operation, a boot-up operation, and so forth. The number of bits included in the command/address signal CA may be set to be different according to the embodiments.

The internal command generation circuit 401 may generate a first internal command RUP and a second internal command BTU based on the command/address signal CA. The first internal command RUP may be activated to execute a first mode. In some embodiments, the first mode may be set as an operation mode in which the rupture operation for storing fuse data FZD in one of a first main fuse cell FC and a first redundancy fuse cell RFC is performed. The second internal command BTU may be activated to execute a second mode. In some embodiments, the second mode may be set as an operation mode in which the boot-up operation for outputting the fuse data FZD stored in the first main fuse cell FC and the first redundancy fuse cell RFC is performed. The internal command generation circuit 401 may be realized to perform the same operation as the internal command generation circuit 101 described with reference to FIG. 1. Thus, detailed descriptions of the internal command generation circuit 401 will be omitted hereinafter.

The internal address generation circuit 403 may generate a row address RADD and a column address CADD based on the command/address signal CA. The internal address generation circuit 403 may be realized to perform the same operation as the internal address generation circuit 103 described with reference to FIG. 1. Thus, detailed descriptions of the internal address generation circuit 403 will be omitted hereinafter.

The redundancy signal generation circuit 404 may generate a redundancy signal REDUN based on the row address RADD and the fuse data FZD. The redundancy signal generation circuit 404 may check whether main fuse cells FC include at least one erroneous cell base on the fuse data FZD. The redundancy signal REDUN may be activated to replace an erroneous main fuse cell FC with the redundancy fuse cell RFC when the erroneous main fuse cell FC is included in the main fuse cells FC. The redundancy signal generation circuit 404 may store the row address RADD having a logic level combination corresponding to the erroneous main fuse cell FC. The redundancy signal generation circuit 404 may activate the redundancy signal REDUN when the row address RADD has a predetermined logic level combination.

The row control circuit 405 may generate a fuse access signal PG and a synthesis word line selection signal SG_S from the redundancy signal REDUN and the row address RADD based on the first internal command RUP and the second internal command BTU. The row control circuit 405 may decode the redundancy signal REDUN and the row address RADD based on the first internal command RUP and the second internal command BTU to selectively activate the fuse access signal PG. The fuse access signal PG may include a first fuse access signal (PG1 of FIG. 11) and a second fuse access signal (PG2 of FIG. 11). The first fuse access signal PG1 may be activated to store the fuse data FZD in the first fuse cell FC and to output the fuse data FZD from the first fuse cell FC. The first fuse access signal PG1 may be activated to store the fuse data FZD in the first fuse cell FC in the first mode. The first fuse access signal PG1 may be activated to output the fuse data FZD from the first fuse cell FC in the second mode. The second fuse access signal PG2 may be activated to store the fuse data FZD in the first redundancy fuse cell RFC and to output the fuse data FZD from the first redundancy fuse cell RFC. The second fuse access signal PG2 may be activated to store the fuse data FZD in the first redundancy fuse cell RFC in the first mode. The second fuse access signal PG2 may be activated to output the fuse data FZD from the first redundancy fuse cell RFC in the second mode. The row control circuit 405 may decode the redundancy signal REDUN and the row address RADD based on the first internal command RUP and the second internal command BTU to selectively activate the synthesis word line selection signal SG_S. The synthesis word line selection signal SG_S may include a first synthesis word line selection signal (SG_S1 of FIG. 11). The first synthesis word line selection signal SG_S1 may be activated to enable the first fuse cell FC and the first redundancy fuse cells RFC.

The row control circuit 405 may activate one of the first fuse access signal PG1 and the second fuse access signal PG2 according to a logic level combination of the redundancy signal REDUN and the row address RADD when the first mode is executed based on the first internal command RUP. The row control circuit 405 may activate the first synthesis word line selection signal SG_S1 according to a logic level combination of the redundancy signal REDUN and the row address RADD when the first mode is executed based on the first internal command RUP. More specifically, the row control circuit 405 may activate the first synthesis word line selection signal SG_S1 and the first fuse access signal PG1 when the redundancy signal REDUN is inactivated and the row address RADD has a logic level combination corresponding to the first main fuse cell FC in the first mode which is executed based on the first internal command RUP. The row control circuit 405 may activate the first synthesis word line selection signal SG_S1 and the second fuse access signal PG2 when the redundancy signal REDUN is activated and the row address RADD has a logic level combination corresponding to the first main fuse cell FC in the first mode which is executed based on the first internal command RUP.

The row control circuit 405 may activate the first synthesis word line selection signal SG_S1, the first fuse access signal PG1, and the second fuse access signal PG2 according to a logic level combination of the redundancy signal REDUN and the row address RADD when the second mode is executed based on the second internal command BTU. More specifically, the row control circuit 405 may activate the first synthesis word line selection signal SG_S1, the first fuse access signal PG1, and the second fuse access signal PG2 when the redundancy signal REDUN is inactivated to have a logic "low" level and the row address RADD has a logic level combination corresponding to the first main fuse cell FC in the second mode which is executed based on the second internal command BTU. The row control circuit 405 may activate the first synthesis word line selection signal SG_S1, the first fuse access signal PG1, and the second fuse access signal PG2 when the redundancy signal REDUN is activated to have a logic "high" level and the row address RADD has a logic level combination corresponding to the first main fuse cell FC in the second mode which is executed based on the second internal command BTU. That is, the row control circuit 405 may activate the first synthesis word line selection signal SG_S1, the first fuse access signal PG1, and the second fuse access signal PG2 when the row address RADD has a logic level combination corresponding to the first main fuse cell FC regardless of a logic level of the redundancy signal REDUN in the second mode.

As described above, the row control circuit 405 may activate the synthesis word line selection signal SG_S for enabling the main fuse cells FC and the redundancy fuse cells RFC included in the array rupture e-fuse (ARE) using a predetermined address decoding technique when the first and second modes are executed, thereby reducing an area of a selection signal driver (SG DRV) 413 for driving the synthesis word line selection signal SG_S and efficiently setting an address decoding technique. The operation of the row control circuit 405 will be described in more detail with reference to FIG. 11 later.

Figure 12:
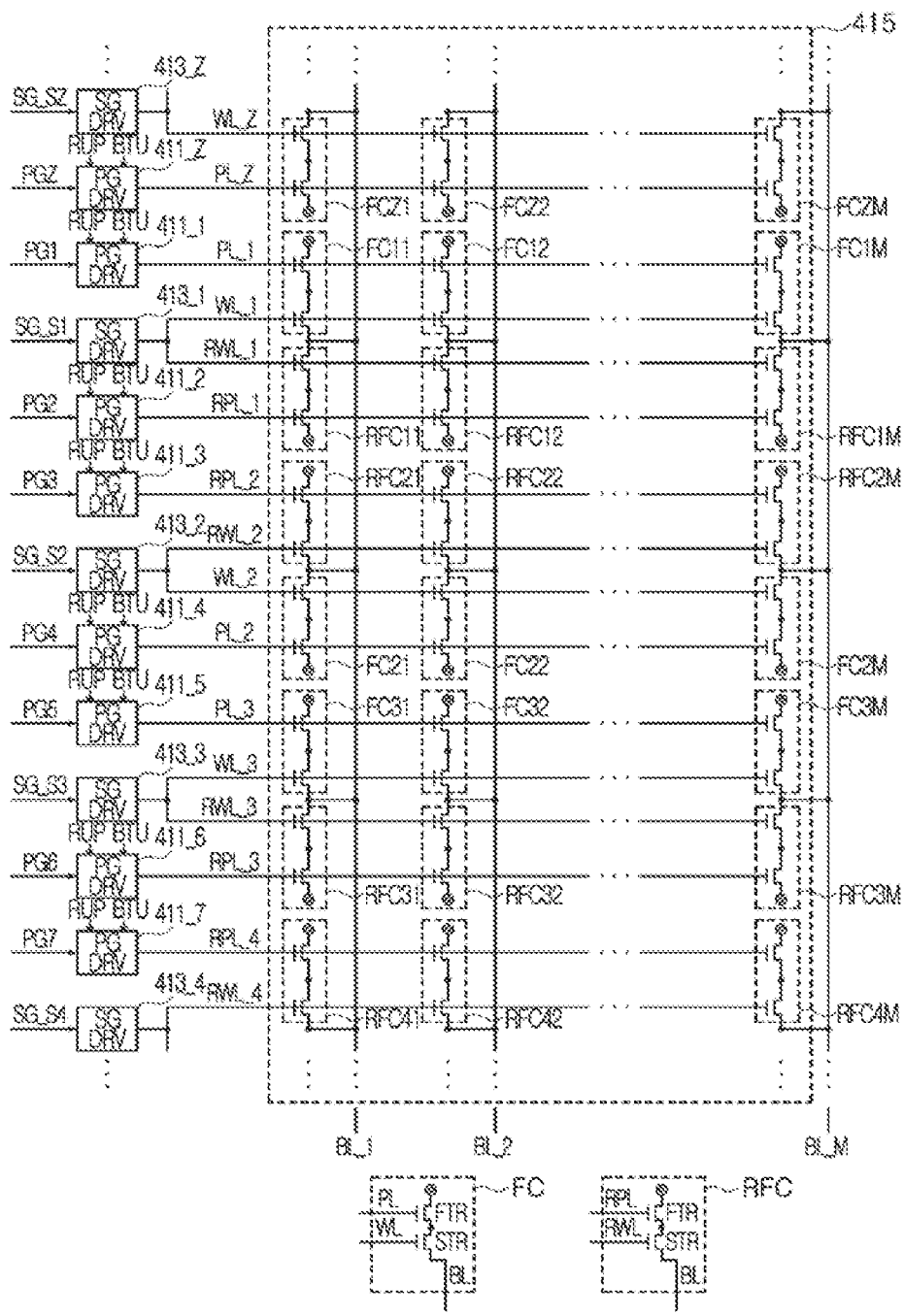
FIG. 12 illustrates an example of a programming circuit included in the electronic device illustrated in FIG. 10.

The column control circuit 407 may decode the column address CADD based on the first internal command RUP and the second internal command BTU to selectively activate at least one of bit lines (BL of FIG. 12). The column control circuit 407 may be realized to perform the same operation as the column control circuit 107 described with reference to FIG. 1. Thus, detailed descriptions of the column control circuit 407 will be omitted hereinafter.

The programming circuit 409 may include an access signal driver (PG DRV) 411, the selection signal driver (SG DRV) 413, and a fuse cell array 415. The programming circuit 409 may store the fuse data FZD in the fuse cells FC and may output the fuse data FZD from the fuse cells, based on the first internal command RUP, the second internal command BTU, the fuse access signal PG, and the synthesis word line selection signal SG_S.

The programming circuit 409 may store the fuse data FZD in the fuse cells in the first mode that is executed based on the first internal command RUP, the synthesis word line selection signal SG_S, and the fuse access signal PG. The programming circuit 409 may store the fuse data FZD in one of the first main fuse cell FC and the first redundancy fuse cell RFC based on the first synthesis word line selection signal SG_S1, the first fuse access signal PG1, and the second fuse access signal PG2 in the first mode. More specifically, the programming circuit 409 may store the fuse data FZD in the first main fuse cell FC when the first synthesis word line selection signal SG_S1 and the first fuse access signal PG1 are activated in the first mode. The programming circuit 409 may store the fuse data FZD in the first redundancy fuse cell RFC when the first synthesis word line selection signal SG_S1 and the second fuse access signal PG2 are activated in the first mode.

The programming circuit 409 may output the fuse data FZD, which are stored in the fuse cells, in the second mode that is executed based on the second internal command BTU, the synthesis word line selection signal SG_S, and the fuse access signal PG. The programming circuit 409 may output the fuse data FZD, which are stored in the first main fuse cell FC, when the first synthesis word line selection signal SG_S1 and the first fuse access signal PG1 are activated in the second mode. The programming circuit 409 may output the fuse data FZD, which are stored in the first redundancy fuse cell RFC, when the first synthesis word line selection signal SG_S1 and the second fuse access signal PG2 are activated in the second mode.

The access signal driver 411 may drive the fuse access signal PG, which is activated, based on the first internal command RUP and the second internal command BTU. The access signal driver 411 may drive the activated fuse access signal PG to a first voltage in the first mode that is executed based on the first internal command RUP. The access signal driver 411 may drive the activated fuse access signal PG to a second voltage in the second mode that is executed based on the second internal command BTU. The first voltage may be set to be higher than the second voltage.

The selection signal driver 413 may drive the activated synthesis word line selection signal SG_S to a third voltage.

The fuse cell array 415 may include a plurality of main fuse cells FC and a plurality of redundancy fuse cells RFC. That is, each of the plurality of fuse cells may be any one of the main fuse cells FC and the redundancy fuse cells RFC. The main fuse cells FC and the redundancy fuse cells RFC may store or output the fuse data FZD based on the driven fuse access signal PG and the driven synthesis word line selection signal SG_S. The operation of the programming circuit 409 will be described in more detail with reference to FIG. 12 later.

The fuse data storage circuit 417 may store the fuse data FZD.

FIG. 11 is a table illustrating an operation of the row control circuit 405 included in the electronic device 400 illustrated in FIG. 10. Referring to FIG. 11, the first mode may be executed when the first internal command RUP has a logic "high(H)" level. The second mode may be executed when the second internal command BTU has a logic "high (H)" level. A target fuse cell may correspond to a fuse cell which is selected by a logic level combination of the row address RADD, a logic level combination of the column address (CADD of FIG. 10), and a logic level of the redundancy signal REDUN. In FIG. 11, an operation that the target fuse cell is selected by a logic level combination of the column address CADD will be omitted. A main fuse cell FC11 may be set as the target fuse cell when the redundancy signal REDUN is inactivated to have a logic "low(L)" level and the row address RADD<1:3> has a logic level combination of 'L, L, H'. A redundancy fuse cell RFC11 may be set as the target fuse cell when the redundancy signal REDUN is activated to have a logic "high(H)" level and the row address RADD<1:3> has a logic level combination of 'L, L, H'.

The row control circuit 405 may generate the first fuse access signal PG1 and the first synthesis word line selection signal SG_S1 which are activated to have a logic "high(H)" level when the redundancy signal REDUN is inactivated and a logic level combination of the row address RADD<1:3> designates the main fuse cell FC11 in the first mode. The first fuse access signal PG1 may be activated to store the fuse data (FZD of FIG. 10) in the main fuse cell FC11 in the first mode. The first synthesis word line selection signal SG_S1 may be activated to enable the main fuse cell FC11 and the redundancy fuse cell RFC11. Thus, the fuse data (FZD of FIG. 10) may be stored in the main fuse cell FC11 when the redundancy signal REDUN is inactivated and a logic level combination of the row address RADD<1:3> designates the main fuse cell FC11 in the first mode.

The row control circuit 405 may generate the first fuse access signal PG1, the second fuse access signal PG2, and the first synthesis word line selection signal SG_S1 which are activated to have a logic "high(H)" level when the redundancy signal REDUN is inactivated and a logic level combination of the row address RADD<1:3> designates the main fuse cell FC11 in the second mode. The first fuse access signal PG1 may be activated to output the fuse data (FZD of FIG. 10), which are stored in the main fuse cell FC11, in the second mode. The second fuse access signal PG2 may be activated to output the fuse data (FZD of FIG. 10), which are stored in the redundancy fuse cell RFC11, in the second mode. Thus, the fuse data (FZD of FIG. 10) may be outputted from the main fuse cell FC11 and the redundancy fuse cell RFC11 when the redundancy signal REDUN is inactivated and a logic level combination of the row address RADD<1:3> designates the main fuse cell FC11 in the second mode.

The row control circuit 405 may generate the second fuse access signal PG2 and the first synthesis word line selection signal SG_S1 which are activated to have a logic "high(H)" level when the redundancy signal REDUN is activated and a logic level combination of the row address RADD<1:3> designates the main fuse cell FC11 in the first mode. The second fuse access signal PG2 may be activated to store the fuse data (FZD of FIG. 10) in the redundancy fuse cell RFC11 in the first mode. Thus, the fuse data (FZD of FIG. 10) may be stored in the redundancy fuse cell RFC11 when the redundancy signal REDUN is activated and a logic level combination of the row address RADD<1:3> designates the main fuse cell FC11 in the first mode.

The row control circuit 405 may generate the first fuse access signal PG1, the second fuse access signal PG2, and the first synthesis word line selection signal SG_S1 which are activated to have a logic "high(H)" level when the redundancy signal REDUN is activated and a logic level combination of the row address RADD<1:3> designates the main fuse cell FC11 in the second mode. Thus, the fuse data (FZD of FIG. 10) may be outputted from the main fuse cell FC11 and the redundancy fuse cell RFC11 when the redundancy signal REDUN Is activated and a logic level combination of the row address RADD<1:3> designates the main fuse cell FC11 in the second mode.

FIG. 12 illustrates an example of the programming circuit 409 included in the electronic device 400 illustrated in FIG. 10. As illustrated in FIG. 12, the programming circuit 409 may include a plurality of access signal drivers (PG DRV) 411_Z and 411_1~411_7, a plurality of selection signal drivers (SG DRV) 413_Z and 413_1~413_4, the fuse cell array 415, a plurality of word lines WL_Z and WL_1~WL_3, a plurality of redundancy word lines RWL_1~RWL_4, a plurality of main program lines PL_Z and PL_1~PL_3, a plurality of redundancy program lines RPL_Z and RPL_1~RPL_4, and a plurality of bit lines BL_1-BL_M.

The access signal driver 411_1 may drive the first fuse access signal PG1, which is activated, based on the first internal command RUP and the second internal command BTU. The access signal driver 411_1 may drive the activated first fuse access signal PG1 to the first voltage in the first mode that is executed based on the first internal command RUP. The access signal driver 411_1 may drive the activated first fuse access signal PG1 to the second voltage in the second mode that is executed based on the second internal command BTU. The access signal driver 4111 may output the driven first fuse access signal PG1 to the main program line PL_1.

The access signal driver 411_2 may drive the second fuse access signal PG2, which is activated, based on the first internal command RUP and the second internal command BTU. The access signal driver 411_2 may drive the activated second fuse access signal PG2 to the first voltage in the first mode that is executed based on the first internal command RUP. The access signal driver 4112 may drive the activated second fuse access signal PG2 to the second voltage in the second mode that is executed based on the second internal command BTU. The access signal driver 411_2 may output the driven second fuse access signal PG2 to the redundancy program line RPL_1.

The selection signal driver 413_1 may drive the first synthesis word line selection signal SG_S1, which is activated, to the third voltage. The selection signal driver 413_1 may output the driven first synthesis word line selection signal SG_S1 to the main word line WL_1 and the redundancy word line RWL_1.

The fuse cell array 415 may include the plurality of main fuse cells FC and the plurality of redundancy fuse cells RFC. Each of the plurality of main fuse cells FC and the plurality of redundancy fuse cells RFC may include a fuse transistor FTR and a selection transistor STR.

A first terminal (e.g., a source terminal) of the fuse transistor FTR included in the main fuse cell FC may be isolated by an isolation layer to be electrically floated. A second terminal (e.g., a drain terminal) of the fuse transistor FTR included in the main fuse cell FC may be electrically connected to a first terminal (e.g., a source terminal) of the selection transistor STR included in the main fuse cell FC such that the fuse transistor FTR and the selection transistor STR are coupled in series. A third terminal (e.g., a gate terminal) of the fuse transistor FTR included in the main fuse cell FC may be electrically connected to any one of the main program lines PL. A second terminal (e.g., a drain terminal) of the selection transistor STR included in the main fuse cell FC may be electrically connected to any one of the bit lines BL. A third terminal (e.g., a gate terminal) of the selection transistor STR included in the main fuse cell FC may be electrically connected to any one of the main word lines WL.

A first terminal (e.g., a source terminal) of the fuse transistor FTR included in the redundancy fuse cell RFC may be isolated by an isolation layer to be electrically floated. A second terminal (e.g., a drain terminal) of the fuse transistor FTR included in the redundancy fuse cell RFC may be electrically connected to a first terminal (e.g., a source terminal) of the selection transistor STR included in the redundancy fuse cell RFC such that the fuse transistor FTR and the selection transistor STR are coupled in series. A third terminal (e.g., a gate terminal) of the fuse transistor FTR included in the redundancy fuse cell RFC may be electrically connected to any one of the redundancy program lines RPL. A second terminal (e.g., a drain terminal) of the selection transistor STR included in the redundancy fuse cell RFC may be electrically connected to any one of the bit lines BL. A third terminal (e.g., a gate terminal) of the selection transistor STR included in the redundancy fuse cell RFC may be electrically connected to any one of the redundancy word lines RWL.

The main fuse cell FC11 may include a first fuse transistor FTR and a first selection transistor STR. The first fuse transistor FTR of the main fuse cell FC11 may store or output the fuse data (FZD of FIG. 10) based on the first fuse access signal PG1 which is driven by the access signal driver 411_1. The first selection transistor STR of the main fuse cell FC11 may be turned on based on the first synthesis word line selection signal SG_S1 which is driven by the selection signal driver 413_1. The first fuse transistor FTR and the first selection transistor STR of the main fuse cell FC11 may be coupled in series. The first selection transistor STR of the main fuse cell FC11 may be turned on when the bit line BL_1 is activated and the first synthesis word line selection signal SG_S1, which is driven to have the third voltage, is inputted to a gate terminal of the first selection transistor STR through the main word line WL_1. The first fuse transistor FTR of the main fuse cell FC11 may store the fuse data (FZD of FIG. 10) when the first selection transistor STR is turned on and the first fuse access signal PG1, which is driven to have the first voltage, is inputted to a gate terminal of the first fuse transistor FTR through the main program line PL_1 in the first mode. The first fuse transistor FTR of the main fuse cell FC11 may be programmed to store the fuse data (FZD of FIG. 10) by rupturing a gate dielectric layer of the first fuse transistor FTR by applying the first fuse access signal PG1, which is driven to have the first voltage, to the gate terminal of the first fuse transistor FTR. The first fuse transistor FTR of the main fuse cell FC11 may output the fuse data (FZD of FIG. 10) to the bit line BL_1 when the first selection transistor STR is turned on and the first fuse access signal PG1, which is driven to have the second voltage, is inputted to the gate terminal of the first fuse transistor FTR through the main program line PL_1 in the second mode.

The redundancy fuse cell RFC11 may include a second fuse transistor FTR and a second selection transistor STR. The second fuse transistor FTR of the redundancy fuse cell RFC11 may store or output the fuse data (FZD of FIG. 10) based on the second fuse access signal PG2 which is driven by the access signal driver 411_2. The second selection transistor STR of the redundancy fuse cell RFC11 may be turned on based on the first synthesis word line selection signal SG_S1 which is driven by the selection signal driver 413_1. The second fuse transistor FTR and the second selection transistor STR of the redundancy fuse cell RFC11 may be coupled in series. The redundancy fuse cell RFC11 may share the bit line BL_1 with the main fuse cell FC11, and the redundancy fuse cell RFC11 and the main fuse cell FC11 may be coupled in parallel to the bit line BL_1. More specifically, the first selection transistor STR of the main fuse cell FC11 and the second selection transistor STR of the redundancy fuse cell RFC11 may be coupled in parallel to the bit line BL_1 to share the bit line BL_1 with each. The second selection transistor STR of the redundancy fuse cell RFC11 may be turned on when the bit line BL_1 is activated and the first synthesis word line selection signal SG_S1, which is driven to have the third voltage, is inputted to a gate terminal of the second selection transistor STR through the redundancy word line RWL_1. The second fuse transistor FTR of the redundancy fuse cell RFC11 may store the fuse data (FZD of FIG. 10) when the second selection transistor STR is turned on and the second fuse access signal PG2, which is driven to have the first voltage, is inputted to a gate terminal of the second fuse transistor FTR through the redundancy program line RPL_1 in the first mode. The second fuse transistor FTR of the redundancy fuse cell RFC11 may be programmed to store the fuse data (FZD of FIG. 10) by rupturing a gate dielectric layer of the second fuse transistor FTR by applying the second fuse access signal PG2, which is driven to have the first voltage, to the gate terminal of the second fuse transistor FTR. The second fuse transistor FTR of the redundancy fuse cell RFC11 may output the fuse data (FZD of FIG. 10) to the bit line BL_1 when the second selection transistor STR is turned on and the second fuse access signal PG2, which is driven to have the second voltage, is inputted to the gate terminal of the second fuse transistor FTR through the redundancy program line RPL_1 in the second mode.

Figure 13:
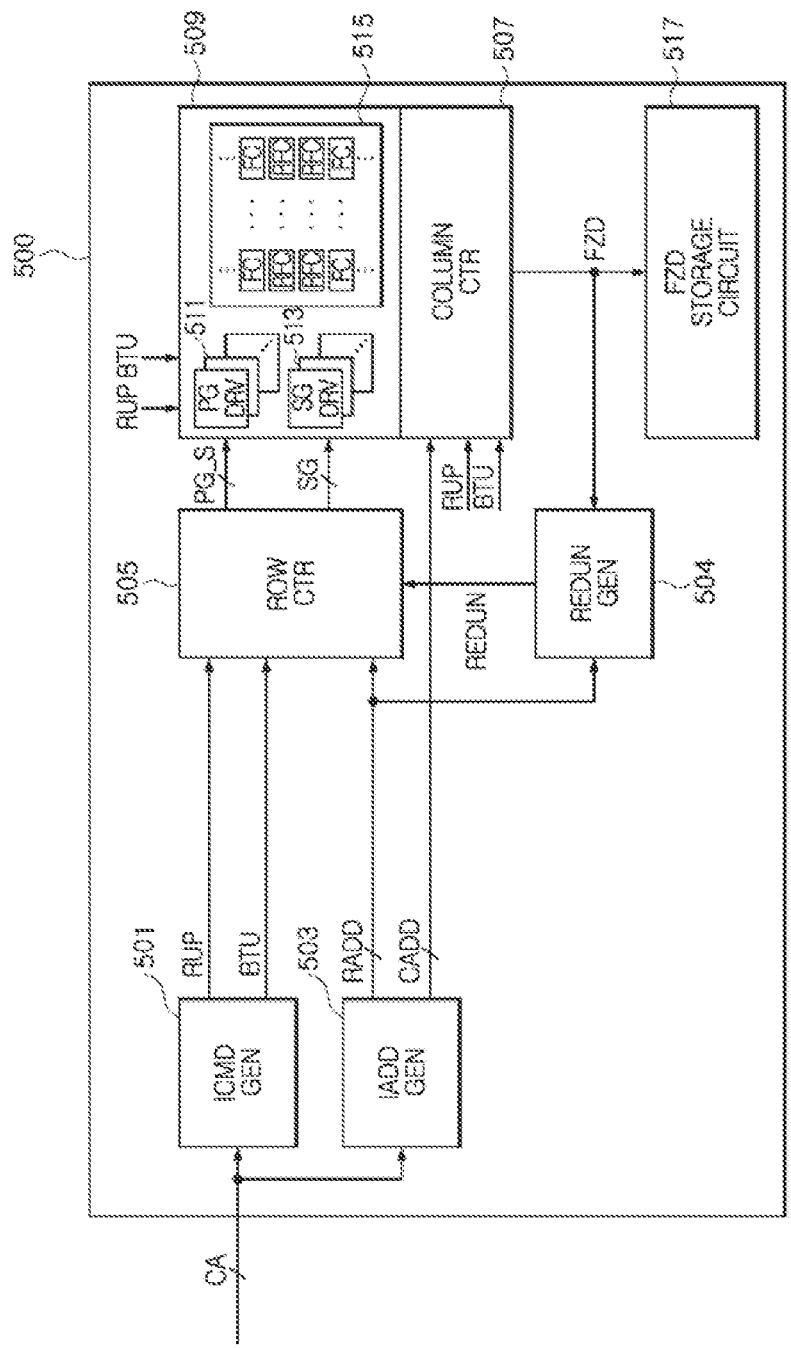
FIG. 13 is a block diagram illustrating a configuration of an electronic device according to a fifth embodiment of the disclosed technology.

FIG. 13 is a block diagram illustrating a configuration of an electronic device 500 according to a fifth embodiment of the disclosed technology. As illustrated in FIG. 13, the electronic device 500 may include an internal command generation circuit (ICMD GEN) 501, an internal address generation circuit (IADD GEN) 503, a redundancy signal generation circuit (REDUN GEN) 504, a row control circuit (ROW CTR) 505, a column control circuit (COLUMN CTR) 507, a programming circuit 509, and a fuse data storage circuit (FZD STORAGE CIRCUIT) 517. The electronic device 500 may be realized using a semiconductor device. The electronic device 500 may receive a command/address signal CA from a controller (not shown) to perform various internal operations such as a rupture operation, a boot-up operation, and so forth. The number of bits included in the command/address signal CA may be set to be different according to the embodiments.

The internal command generation circuit 501 may generate a first internal command RUP and a second internal command BTU based on the command/address signal CA. The first internal command RUP may be activated to execute a first mode. In some embodiments, the first mode may be set as an operation mode in which the rupture operation for storing fuse data FZD in one of a main fuse cell FC and a redundancy fuse cell RFC is performed. The second internal command BTU may be activated to execute a second mode. In some embodiments, the second mode may be set as an operation mode in which the boot-up operation for outputting the fuse data FZD stored in the main fuse cell FC and the redundancy fuse cell RFC is performed. The internal command generation circuit 501 may be realized to perform the same operation as the internal command generation circuit 101 described with reference to FIG. 1. Thus, detailed descriptions of the internal command generation circuit 501 will be omitted hereinafter.

The internal address generation circuit 503 may generate a row address RADD and a column address CADD based on the command/address signal CA. The internal address generation circuit 203 may be realized to perform the same operation as the internal address generation circuit 103 described with reference to FIG. 1. Thus, detailed descriptions of the internal address generation circuit 503 will be omitted hereinafter.

The redundancy signal generation circuit 504 may generate a redundancy signal REDUN based on the row address RADD and the fuse data FZD. The redundancy signal generation circuit 504 may be realized to perform the same operation as the redundancy signal generation circuit 404 described with reference to FIG. 10. Thus, detailed descriptions of the redundancy signal generation circuit 504 will be omitted hereinafter.

The row control circuit 505 may generate a synthesis fuse access signal PG_S and a word line selection signal SG from the redundancy signal REDUN and the row address RADD based on the first internal command RUP and the second internal command BTU. The row control circuit 505 may decode the redundancy signal REDUN and the row address RADD based on the first internal command RUP and the second internal command BTU to selectively activate the synthesis fuse access signal PG_S. The synthesis fuse access signal PG_S may include a first synthesis fuse access signal (PG_S1 of FIG. 14) and a second synthesis fuse access signal (PG_S2 of FIG. 14). The first synthesis fuse access signal PG_S1 may be activated to store the fuse data FZD in a first fuse cell and a first main fuse cell FC and to output the fuse data FZD from the first fuse cell and the first main fuse cell FC. In some embodiments, the first fuse cell may be one of the main fuse cell FC and the redundancy fuse cell RFC. The first synthesis fuse access signal PG_S1 may be activated to store the fuse data FZD in the first fuse cell and the first main fuse cell FC in the first mode. The first synthesis fuse access signal PG_S1 may be activated to output the fuse data FZD from the first fuse cell and the first main fuse cell FC in the second mode. The second synthesis fuse access signal PG_S2 may be activated to store the fuse data FZD in a second fuse cell and a first redundancy fuse cell RFC and to output the fuse data FZD from the second fuse cell and the first redundancy fuse cell RFC. In some embodiments, the second fuse cell may be one of the main fuse cell FC and the redundancy fuse cell RFC. The second synthesis fuse access signal PG_S2 may be activated to store the fuse data FZD in the second fuse cell and the first redundancy fuse cell RFC in the first mode. The second synthesis fuse access signal PG_S2 may be activated to output the fuse data FZD from the second fuse cell and the first redundancy fuse cell RFC in the second mode. The row control circuit 505 may decode the redundancy signal REDUN and the row address RADD based on the first internal command RUP and the second internal command BTU to selectively activate the word line selection signal SG. The word line selection signal SG may include a first word line selection signal (SG1 of FIG. 14) and a second word line selection signal (SG2 of FIG. 14). The first word line selection signal SG1 may be activated to enable the first main fuse cell FC. The second word line selection signal SG2 may be activated to enable the first redundancy fuse cell RFC.

The row control circuit 505 may activate the first word line selection signal SG1 and the first synthesis fuse access signal PG_S1 or the second word line selection signal SG2 and the second synthesis fuse access signal PG_S2 according to a logic level combination of the redundancy signal REDUN and the row address RADD when the first mode is executed based on the first internal command RUP. More specifically, the row control circuit 505 may activate the first word line selection signal SG1 and the first synthesis fuse access signal PG_S1 when the redundancy signal REDUN is inactivated and the row address RADD has a logic level combination corresponding to the first main fuse cell FC in the first mode that is executed based on the first internal command RUP. The row control circuit 505 may activate the second word line selection signal SG2 and the second synthesis fuse access signal PG_S2 when the redundancy signal REDUN is activated and the row address RADD has a logic level combination corresponding to the first main fuse cell FC in the first mode that is executed based on the first internal command RUP.

The row control circuit 505 may activate the first word line selection signal SG1, the second word line selection signal SG2, the first synthesis fuse access signal PG_S1, and the second synthesis fuse access signal PG_S2 according to a logic level combination of the redundancy signal REDUN and the row address RADD when the second mode is executed based on the second internal command BTU. More specifically, the row control circuit 505 may activate the first word line selection signal SG1, the second word line selection signal SG2, the first synthesis fuse access signal PG_S1, and the second synthesis fuse access signal PG_S2 when the redundancy signal REDUN is inactivated to have a logic "low" level and the row address RADD has a logic level combination corresponding to the first main fuse cell FC in the second mode which is executed based on the second internal command BTU. The row control circuit 505 may activate the first word line selection signal SG1, the second word line selection signal SG2, the first synthesis fuse access signal PG_S1, and the second synthesis fuse access signal PG_S2 when the redundancy signal REDUN is activated to have a logic "high" level and the row address RADD has a logic level combination corresponding to the second fuse cell FC in the second mode which is executed based on the second internal command BTU. That is, the row control circuit 505 may activate the first word line selection signal SG1, the second word line selection signal SG2, the first synthesis fuse access signal PG_S1, and the second synthesis fuse access signal PG_S2 when the row address RADD has a logic level combination corresponding to the first main fuse cell FC regardless of a logic level of the redundancy signal REDUN in the second mode which is executed based on the second internal command BTU.

As described above, the row control circuit 505 may activate the synthesis fuse access signal PG_S for storing the fuse data FZD in a plurality of main fuse cells FC and a plurality of redundancy fuse cells RFC included in the array rupture e-fuse (ARE) and for outputting the fuse data FZD from the plurality of fuse cells FC and the plurality of redundancy fuse cells RFC included in the array rupture e-fuse (ARE) using a predetermined address decoding technique when the first and second modes are executed, thereby reducing an area of an access signal driver (PG DRV) 511 for driving the synthesis fuse access signal PG_S. The operation of the row control circuit 505 will be described in more detail with reference to FIG. 14 later.

Figure 15:
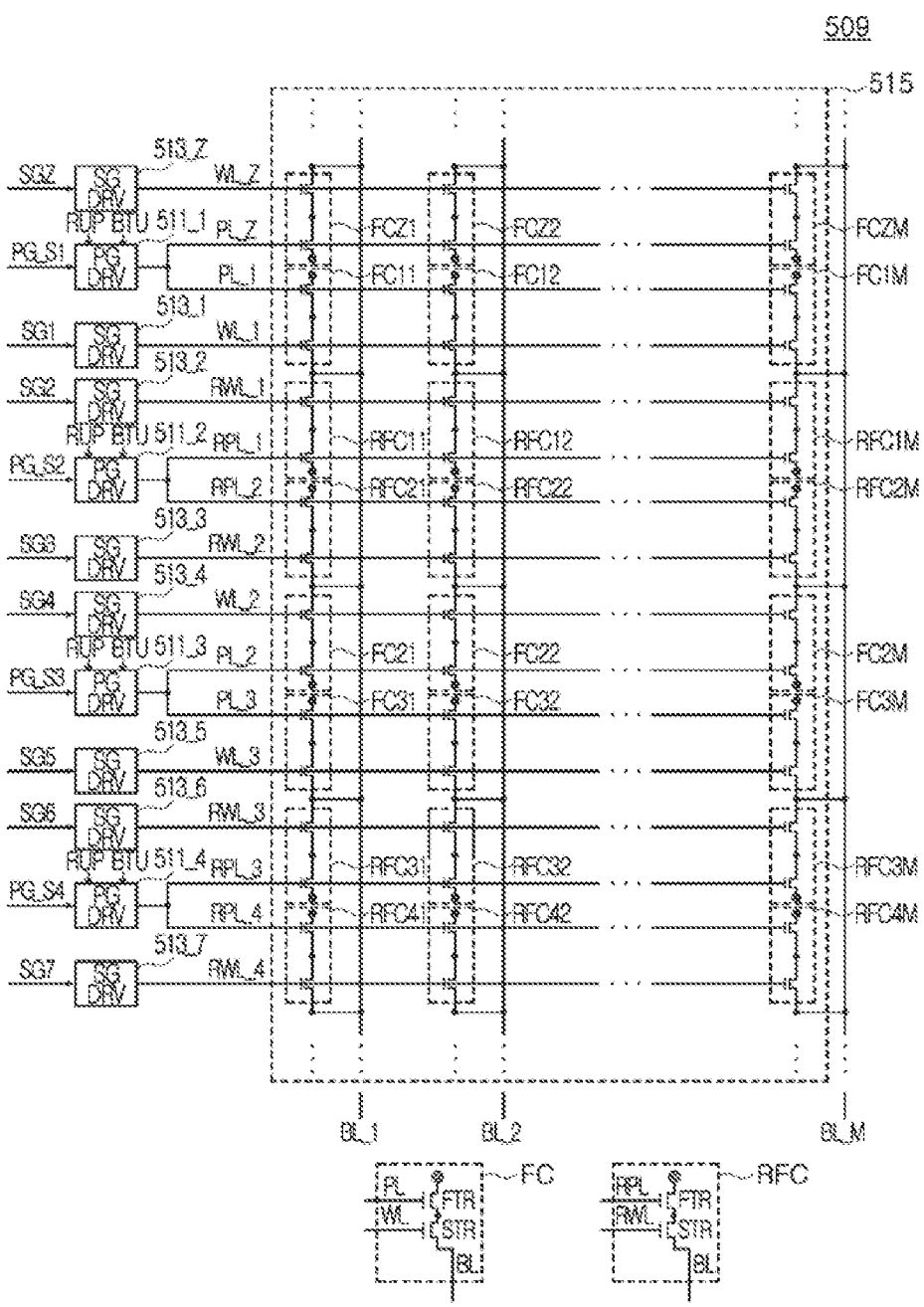
FIG. 15 illustrates an example of a programming circuit included in the electronic device illustrated in FIG. 13.

The column control circuit 507 may decode the column address CADD based on the first internal command RUP and the second internal command BTU to selectively activate at least one of bit lines (BL of FIG. 15). The column control circuit 507 may be realized to perform the same operation as the column control circuit 107 described with reference to FIG. 1. Thus, detailed descriptions of the column control circuit 507 will be omitted hereinafter.

The programming circuit 509 may include the access signal driver (PG DRV) 511, a selection signal driver (SG DRV) 513, and a fuse cell array 515. The programming circuit 509 may store the fuse data FZD in the fuse cells and may output the fuse data FZD from the fuse cells, based on the first internal command RUP, the second internal command BTU, the synthesis fuse access signal PG_S, and the word line selection signal SG.

The programming circuit 509 may store the fuse data FZD in the fuse cells in the first mode that is executed based on the first internal command RUP, the word line selection signal SG, and the synthesis fuse access signal PG_S. The programming circuit 509 may store the fuse data FZD in one of the first main fuse cell FC and the first redundancy fuse cell RFC based on the first word line selection signal SG1, the second word line selection signal SG2, the first synthesis fuse access signal PG_S1, and the second synthesis fuse access signal PG_S2 in the first mode. More specifically, the programming circuit 509 may store the fuse data FZD in the first main fuse cell FC when the first word line selection signal SG1 and the first synthesis fuse access signal PG_S1 are activated in the first mode. The programming circuit 509 may store the fuse data FZD in the first redundancy fuse cell RFC when the second word line selection signal SG2 and the second synthesis fuse access signal PG_S2 are activated in the first mode.

The programming circuit 509 may output the fuse data FZD, which are stored in the fuse cells, in the second mode that is executed based on the second internal command BTU, the word line selection signal SG, and the synthesis fuse access signal PG_S. The programming circuit 509 may output the fuse data FZD, which are stored in the first main fuse cell FC, when the first word line selection signal SG1 and the first synthesis fuse access signal PG_S1 are activated in the second mode. The programming circuit 509 may output the fuse data FZD, which are stored in the first redundancy fuse cell RFC, when the second word line selection signal SG2 and the second synthesis fuse access signal PG_S2 are activated in the second mode.

The access signal driver 511 may drive the synthesis fuse access signal PG_S, which is activated, based on the first internal command RUP and the second internal command BTU. The access signal driver 511 may drive the activated synthesis fuse access signal PG_S to a first voltage in the first mode that is executed based on the first internal command RUP. The access signal driver 511 may drive the activated synthesis fuse access signal PG_S to a second voltage in the second mode that is executed based on the second internal command BTU. The first voltage may be set to be higher than the second voltage.

The selection signal driver 513 may drive the activated word line selection signal SG to a third voltage.

The fuse cell array 515 may include a plurality of fuse cells. That is, each of the plurality of fuse cells may be any one of the main fuse cells FC and the redundancy fuse cells RFC. The main fuse cells FC and the redundancy fuse cells RFC may store or output the fuse data FZD based on the driven synthesis fuse access signal PG_S and the driven word line selection signal SG. The operation of the programming circuit 509 will be described in more detail with reference to FIG. 15 later.

The fuse data storage circuit 517 may store the fuse data FZD.

FIG. 14 is a table illustrating an operation of the row control circuit 505 included in the electronic device 500 illustrated in FIG. 13. Referring to FIG. 14, the first mode, the second mode, and a target fuse cell indicated in the present embodiment may be defined to have substantially the same meanings as the first mode, the second mode, and the target fuse cell described with reference to FIG. 11. Thus, detailed descriptions of the first mode, the second mode, and the target fuse cell indicated in the present embodiment will be omitted hereinafter.

The row control circuit 505 may generate the first synthesis fuse access signal PG_S1 and the first word line selection signal SG1 which are activated to have a logic "high(H)" level when the redundancy signal REDUN is inactivated and a logic level combination of a row address RADD<1:3> designates a main fuse cell FC11 in the first mode. The first synthesis fuse access signal PG_S1 may be activated to store the fuse data (FZD of FIG. 13) in a main fuse cell FCZ1 and the main fuse cell FC11 in the first mode. The first word line selection signal SG1 may be activated to enable the main fuse cell FC11. Thus, the fuse data (FZD of FIG. 13) may be stored in the main fuse cell FC11 when the redundancy signal REDUN is inactivated and a logic level combination of the row address RADD<1:3> designates the main fuse cell FC11 in the first mode.

The row control circuit 505 may generate the first synthesis fuse access signal PG_S1, the second synthesis fuse access signal PG_S2, the first word line selection signal SG1, and the second word line selection signal SG2 which are activated to have a logic "high(H)" level when the redundancy signal REDUN is inactivated and a logic level combination of the row address RADD<1:3> designates the main fuse cell FC11 in the second mode. The first synthesis fuse access signal PG_S1 may be activated to output the fuse data (FZD of FIG. 13), which are stored in the main fuse cell FCZ1 and the main fuse cell FC11, in the second mode. The second synthesis fuse access signal PG_S2 may be activated to output the fuse data (FZD of FIG. 13), which are stored in a redundancy fuse cell RFC11 and a redundancy fuse cell RFC21, in the second mode. The second word line selection signal SG2 may be activated to enable the redundancy fuse cell RFC11. Thus, the fuse data (FZD of FIG. 13) may be outputted from the main fuse cells FC11 and the redundancy fuse cell RFC11 when the redundancy signal REDUN is inactivated and a logic level combination of the row address RADD<1:3> designates the fuse cell FC11 in the second mode.

The row control circuit 505 may generate the second synthesis fuse access signal PG_S2 and the second word line selection signal SG2 which are activated to have a logic "high(H)" level when the redundancy signal REDUN is activated and a logic level combination of the row address RADD<1:3> designates the main fuse cell FC11 in the first mode. The second synthesis fuse access signal PG_S2 may be activated to store the fuse data (FZD of FIG. 13) in the redundancy fuse cell RFC11 and the redundancy fuse cell RFC21 in the first mode. Thus, the fuse data (FZD of FIG. 13) may be stored in the redundancy fuse cell RFC11 when the redundancy signal REDUN is activated and a logic level combination of the row address RADD<1:3> designates the main fuse cell FC11 in the first mode.

The row control circuit 505 may generate the first synthesis fuse access signal PG_S1, the second synthesis fuse access signal PG_S2, the first word line selection signal SG1, and the second word line selection signal SG2 which are activated to have a logic "high(H)" level when the redundancy signal REDUN is activated and a logic level combination of the row address RADD<1:3> designates the main fuse cell FC11 in the second mode. Thus, the fuse data (FZD of FIG. 13) may be outputted from the main fuse cell FC11 and the redundancy fuse cell RFC11 when the redundancy signal REDUN is activated and a logic level combination of the row address RADD<1:3> designates the main fuse cell FC11 in the second mode.

FIG. 15 illustrates an example of the programming circuit 509 included in the electronic device 500 illustrated in FIG. 13. As illustrated in FIG. 15, the programming circuit 509 may include a plurality of access signal drivers (PG DRV) 511_1~511_4, a plurality of selection signal drivers (SG DRV) 513_Z and 513_1~513_7, the fuse cell array 515, a plurality of main word lines WL_Z and WL_1~WL_3, a plurality of redundancy word lines RWL_1~RWL_4, a plurality of main program lines PL_Z and PL_1~PL_3, a plurality of redundancy program lines RPL_1~RPL_3, and a plurality of bit lines BL_1~BL_M.

The access signal driver 511_1 may drive the first synthesis fuse access signal PG_S1, which is activated, based on the first internal command RUP and the second internal command BTU. The access signal driver 511_1 may drive the activated first synthesis fuse access signal PG_S1 to the first voltage in the first mode that is executed based on the first internal command RUP. The access signal driver 511_1 may drive the activated first synthesis fuse access signal PG_S1 to the second voltage in the second mode that is executed based on the second internal command BTU. The access signal driver 511_1 may output the driven first synthesis fuse access signal PG_S1 to the main program line PL_Z and the main program line PL_1.

The access signal driver 511_2 may drive the second synthesis fuse access signal PG_S2, which is activated, based on the first internal command RUP and the second internal command BTU. The access signal driver 511_2 may drive the activated second synthesis fuse access signal PG_S2 to the first voltage in the first mode that is executed based on the first internal command RUP. The access signal driver 511_2 may drive the activated second synthesis fuse access signal PG_S2 to the second voltage in the second mode that is executed based on the second internal command BTU. The access signal driver 511_2 may output the driven second synthesis fuse access signal PG_S2 to the redundancy program line RPL_1 and the redundancy program line RPL_2.

The selection signal driver 513_1 may drive the first word line selection signal SG1, which is activated, to the third voltage. The selection signal driver 513_1 may output the driven first word line selection signal SG1 to the main word line WL_1.

The selection signal driver 513_2 may drive the second word line selection signal SG2, which is activated, to the third voltage. The selection signal driver 513_2 may output the driven second word line selection signal SG2 to the redundancy word line RWL_1.

The fuse cell array 515 may include a plurality of main fuse cells FC and a plurality of redundancy fuse cells RFC. Each of the main fuse cells FC illustrated in the present embodiment may have the same configuration as the main fuse cell FC described with reference to FIG. 12, and each of the redundancy fuse cells RFC illustrated in the present embodiment may have the same configuration as the redundancy fuse cell RFC described with reference to FIG. 12. Thus, detailed configurations of the main fuse cells FC and the redundancy fuse cells RFC illustrated in the present embodiment will be omitted hereinafter.

The main fuse cell FC11 may include a first fuse transistor FTR and a first selection transistor STR. The first fuse transistor FTR of the main fuse cell FC11 may store or output the fuse data (FZD of FIG. 13) based on the first synthesis fuse access signal PG_S1 which is driven by the access signal driver 511_1. The first selection transistor STR of the main fuse cell FC11 may be turned on based on the first word line selection signal SG1 which is driven by the selection signal driver 513_1. The first fuse transistor FTR and the first selection transistor STR of the main fuse cell FC11 may be coupled in series. The first selection transistor STR of the main fuse cell FC11 may be turned on when the bit line BL_1 is activated and the first word line selection signal SG1, which is driven to have the third voltage, is inputted to a gate terminal of the first selection transistor STR through the main word line WL_1. The first fuse transistor FTR of the main fuse cell FC11 may store the fuse data (FZD of FIG. 13) when the first selection transistor STR is turned on and the first synthesis fuse access signal PG_S1, which is driven to have the first voltage, is inputted to a gate terminal of the first fuse transistor FTR through the main program line PL_1 in the first mode. The first fuse transistor FTR of the main fuse cell FC11 may be programmed to store the fuse data (FZD of FIG. 13) by rupturing a gate dielectric layer of the first fuse transistor FTR by applying the first synthesis fuse access signal PG_S1, which is driven to have the first voltage, to the gate terminal of the first fuse transistor FTR. The first fuse transistor FTR of the main fuse cell FC11 may output the fuse data (FZD of FIG. 13) to the bit line BL_1 when the first selection transistor STR is turned on and the first synthesis fuse access signal PG_S1, which is driven to have the second voltage, is inputted to the gate terminal of the first fuse transistor FTR through the main program line PL_1 in the second mode.

The redundancy fuse cell RFC11 may include a second fuse transistor FTR and a second selection transistor STR. The second fuse transistor FTR of the redundancy fuse cell RFC11 may store or output the fuse data (FZD of FIG. 13) based on the second synthesis fuse access signal PG_S2 which is driven by the access signal driver 511_2. The second selection transistor STR of the redundancy fuse cell RFC11 may be turned on based on the second word line selection signal SG2 which is driven by the selection signal driver 513_2. The second fuse transistor FTR and the second selection transistor STR of the redundancy fuse cell RFC11 may be coupled in series. The redundancy fuse cell RFC11 may share the bit line BL_1 with the main fuse cell FC11, and the redundancy fuse cell RFC11 and the main fuse cell FC11 may be coupled in parallel to the bit line BL_1. More specifically, the first selection transistor STR of the main fuse cell FC11 and the second selection transistor STR of the redundancy fuse cell RFC11 may be coupled in parallel to the bit line BL_1 to share the bit line BL_1 with each. The second selection transistor STR of the redundancy fuse cell RFC11 may be turned on when the bit line BL_1 is activated and the second word line selection signal SG2, which is driven to have the third voltage, is inputted to a gate terminal of the second selection transistor STR through the redundancy word line WL_1. The second fuse transistor FTR of the redundancy fuse cell RFC11 may store the fuse data (FZD of FIG. 13) when the second selection transistor STR is turned on and the second synthesis fuse access signal PG_S2, which is driven to have the first voltage, is inputted to a gate terminal of the second fuse transistor FTR through the redundancy program line RPL_1 in the first mode. The second fuse transistor FTR of the redundancy fuse cell RFC11 may be programmed to store the fuse data (FZD of FIG. 13) by rupturing a gate dielectric layer of the second fuse transistor FTR by applying the second synthesis fuse access signal PG_S2, which is driven to have the first voltage, to the gate terminal of the second fuse transistor FTR. The second fuse transistor FTR of the redundancy fuse cell RFC11 may output the fuse data (FZD of FIG. 13) to the bit line BL_1 when the second selection transistor STR is turned on and the second synthesis fuse access signal PG_S2, which is driven to have the second voltage, is inputted to the gate terminal of the second fuse transistor FTR through the redundancy program line RPL_1 in the second mode.

FIG. 16 is a block diagram illustrating a configuration of an electronic device 600 according to a sixth embodiment of the disclosed technology. As illustrated in FIG. 16, the electronic device 600 may include an internal command generation circuit (ICMD GEN) 601, an internal address generation circuit (IADD GEN) 603, a redundancy signal generation circuit (REDUN GEN) 604, a row control circuit (ROW CTR) 605, a column control circuit (COLUMN CTR) 607, a programming circuit 609, and a fuse data storage circuit (FZD STORAGE CIRCUIT) 617. The electronic device 600 may be realized using a semiconductor device. The electronic device 600 may receive a command/address signal CA from a controller (not shown) to perform various internal operations such as a rupture operation, a boot-up operation, and so forth. The number of bits included in the command/address signal CA may be set to be different according to the embodiments.

The internal command generation circuit 301 may generate a first internal command RUP and a second internal command BTU based on the command/address signal CA. The first internal command RUP may be activated to execute a first mode. In some embodiments, the first mode may be set as an operation mode in which the rupture operation for storing fuse data FZD in one of a first main fuse cell FC and a first redundancy fuse cell RFC is performed. The second internal command BTU may be activated to execute a second mode. In some embodiments, the second mode may be set as an operation mode in which the boot-up operation for outputting the fuse data FZD stored in the first main fuse cell FC and the first redundancy fuse cell RFC is performed. The internal command generation circuit 601 may be realized to perform the same operation as the internal command generation circuit 101 described with reference to FIG. 1. Thus, detailed descriptions of the internal command generation circuit 601 will be omitted hereinafter.

The internal address generation circuit 603 may generate a row address RADD and a column address CADD based on the command/address signal CA. The internal address generation circuit 603 may be realized to perform the same operation as the internal address generation circuit 103 described with reference to FIG. 1. Thus, detailed descriptions of the internal address generation circuit 603 will be omitted hereinafter.

The redundancy signal generation circuit 604 may generate a redundancy signal REDUN based on the row address RADD and the fuse data FZD. The redundancy signal generation circuit 604 may be realized to perform the same operation as the redundancy signal generation circuit 404 described with reference to FIG. 10. Thus, detailed descriptions of the redundancy signal generation circuit 604 will be omitted hereinafter.

The row control circuit 605 may generate a synthesis fuse access signal PG_S and a synthesis word line selection signal SG_S from the redundancy signal REDUN and the row address RADD based on the first internal command RUP and the second internal command BTU. The row control circuit 605 may decode the redundancy signal REDUN and the row address RADD based on the first internal command RUP and the second internal command BTU to selectively activate the synthesis fuse access signal PG_S. The synthesis fuse access signal PG_S may include a first synthesis fuse access signal (PG_S1 of FIG. 17) and a second synthesis fuse access signal (PG_S2 of FIG. 17). The first synthesis fuse access signal PG_S1 may be activated to store the fuse data FZD in a first fuse cell and a first main fuse cell FC and to output the fuse data FZD from the first fuse cell and the first main fuse cell FC. In some embodiments, the first fuse cell may be one of the main fuse cell FC and the redundancy fuse cell RFC. The first synthesis fuse access signal PG_S1 may be activated to store the fuse data FZD in the first fuse cell and the first main fuse cell FC in the first mode. The first synthesis fuse access signal PG_S1 may be activated to output the fuse data FZD from the first fuse cell and the first main fuse cell FC in the second mode. The second synthesis fuse access signal PG_S2 may be activated to store the fuse data FZD in a second fuse cell and a first redundancy fuse cell RFC and to output the fuse data FZD from the second fuse cell and the first redundancy fuse cell RFC. In some embodiments, the second fuse cell may be one of the main fuse cell FC and the redundancy fuse cell RFC. The second synthesis fuse access signal PG_S2 may be activated to store the fuse data FZD in the second fuse cell and the first redundancy fuse cell RFC in the first mode. The second synthesis fuse access signal PG_S2 may be activated to output the fuse data FZD from the second fuse cell and the first redundancy fuse cell RFC in the second mode. The row control circuit 605 may decode the redundancy signal REDUN and the row address RADD based on the first internal command RUP and the second internal command BTU to selectively activate the synthesis word line selection signal SG_S. The synthesis word line selection signal SG_S may include a first synthesis word line selection signal (SG_S1 of FIG. 17). The first synthesis word line selection signal SG_S1 may be activated to enable the first main fuse cell FC and the first redundancy fuse cell RFC.

The row control circuit 605 may activate one of the first synthesis fuse access signal PG_S1 and the second synthesis fuse access signal PG_S2 according to a logic level combination of the redundancy signal REDUN and the row address RADD when the first mode is executed based on the first internal command RUP. The row control circuit 605 may activate the first synthesis fuse access signal PG_S1 according to a logic level combination of the redundancy signal REDUN and the row address RADD in the first mode that is executed based on the first internal command RUP. More specifically, the row control circuit 605 may activate the first synthesis word line selection signal SG_S1 and the first synthesis fuse access signal PG_S1 when the redundancy signal REDUN is inactivated and the row address RADD has a logic level combination corresponding to the first main fuse cell FC in the first mode that is executed based on the first internal command RUP. The row control circuit 605 may activate the first synthesis word line selection signal SG_S1 and the second synthesis fuse access signal PG_S2 when the redundancy signal REDUN is activated and the row address RADD has a logic level combination corresponding to the first main fuse cell FC in the first mode that is executed based on the first internal command RUP.

The row control circuit 605 may activate the first synthesis word line selection signal SG_S1, the first synthesis fuse access signal PG_S1, and the second synthesis fuse access signal PG_S2 according to a logic level combination of the redundancy signal REDUN and the row address RADD when the second mode is executed based on the second internal command BTU. More specifically, the row control circuit 605 may activate the first synthesis word line selection signal SG_S1, the first synthesis fuse access signal PG_S1, and the second synthesis fuse access signal PG_S2 when the redundancy signal REDUN is inactivated to have a logic "low" level and the row address RADD has a logic level combination corresponding to the first main fuse cell FC in the second mode that is executed based on the second internal command BTU. The row control circuit 605 may activate the first synthesis word line selection signal SG_S1, the first synthesis fuse access signal PG_S1, and the second synthesis fuse access signal PG_S2 when the redundancy signal REDUN is activated to have a logic "high" level and the row address RADD has a logic level combination corresponding to a second redundancy fuse cell RFC in the second mode that is executed based on the second internal command BTU. That is, the row control circuit 605 may activate the first synthesis word line selection signal SG_S1, the first synthesis fuse access signal PG_S1, and the second synthesis fuse access signal PG_S2 when the row address RADD has a logic level combination corresponding to the first main fuse cell FC regardless of a logic level of the redundancy signal REDUN in the second mode that is executed based on the second internal command BTU.

As described above, the row control circuit 605 may activate the synthesis fuse access signal PG_S for storing the fuse data FZD in a plurality of main fuse cells FC and a plurality of redundancy fuse cells RFC included in the array rupture e-fuse (ARE) and for outputting the fuse data FZD from the plurality of main fuse cells FC and the plurality of redundancy fuse cells RFC included in the array rupture e-fuse (ARE) using a predetermined address decoding technique when the first and second modes are executed, thereby reducing an area of an access signal driver (PG DRV) 611 for driving the synthesis fuse access signal PG_S and efficiently setting an address decoding technique. In addition, the row control circuit 605 may activate the synthesis word line selection signal SG_S for enabling the plurality of main fuse cells FC and the plurality of redundancy fuse cells RFC included in the array rupture e-fuse (ARE) using a predetermined address decoding technique when the first and second modes are executed, thereby reducing an area of a selection signal driver (SG DRV) 613 for driving the synthesis word line selection signal SG_S. Operations of the row control circuit 605 will be described in more detail with reference to FIG. 17 later.

Figure 18:
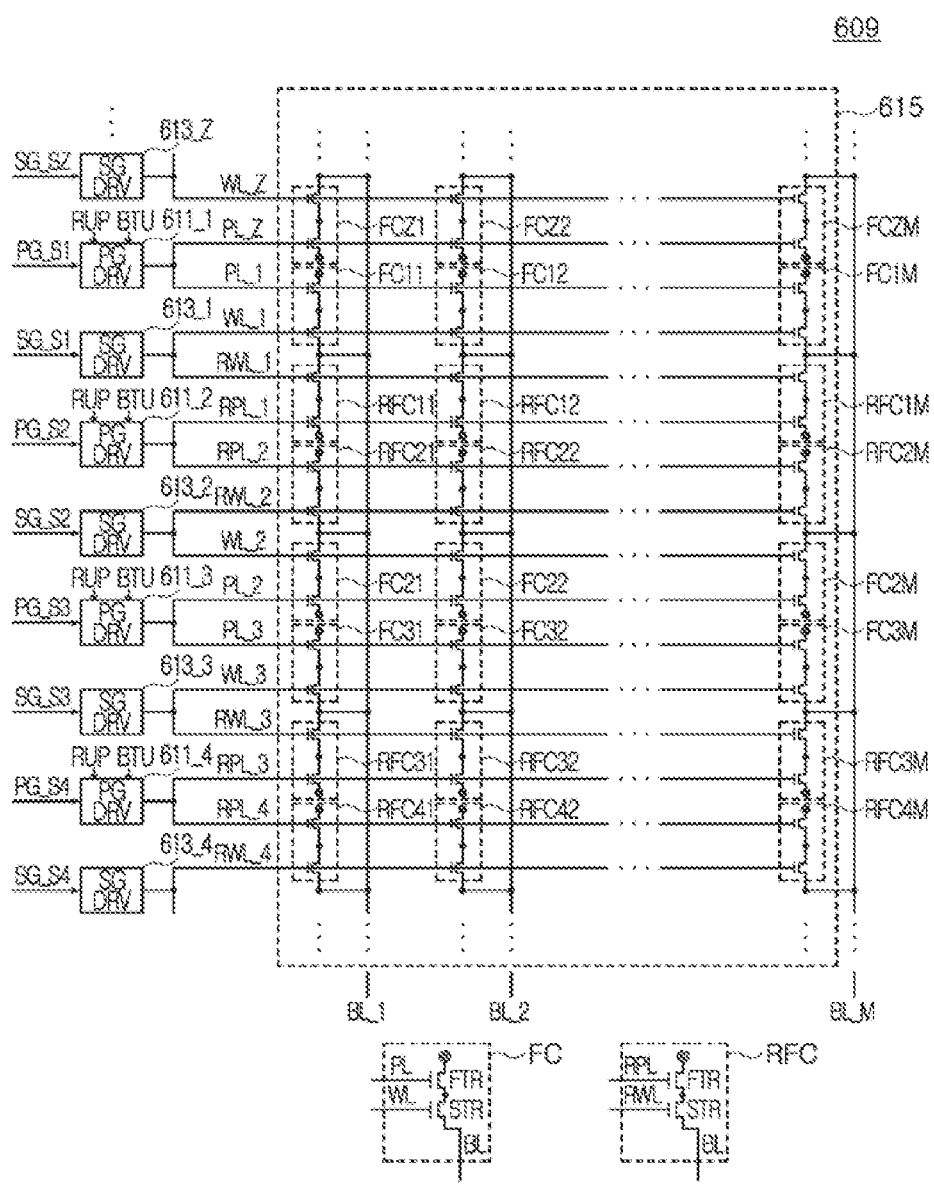
FIG. 18 illustrates an example of a programming circuit included in the electronic device illustrated in FIG. 16.

The column control circuit 607 may decode the column address CADD based on the first internal command RUP and the second internal command BTU to selectively activate at least one of bit lines (BL of FIG. 18). The column control circuit 607 may be realized to perform the same operation as the column control circuit 107 described with reference to FIG. 1. Thus, detailed descriptions of the column control circuit 607 will be omitted hereinafter.

The programming circuit 609 may include the access signal driver (PG DRV) 611, the selection signal driver (SG DRV) 613, and a fuse cell array 615. The programming circuit 609 may store the fuse data FZD in the fuse cells and may output the fuse data FZD from the fuse cells, based on the first internal command RUP, the second internal command BTU, the synthesis fuse access signal PG_S, and the synthesis word line selection signal SG_S.

The programming circuit 609 may store the fuse data FZD in the fuse cells based on the synthesis word line selection signal SG_S and the synthesis fuse access signal PG_S in the first mode that is executed based on the first internal command RUP. The programming circuit 609 may store the fuse data FZD in one of the first main fuse cell FC and the first redundancy fuse cell RFC based on the first synthesis word line selection signal SG_S1, the first synthesis fuse access signal PG_S1, and the second synthesis fuse access signal PG_S2 in the first mode. More specifically, the programming circuit 609 may store the fuse data FZD in the first main fuse cell FC when the first synthesis word line selection signal SG_S1 and the first synthesis fuse access signal PG_S1 are activated in the first mode. The programming circuit 609 may store the fuse data FZD in the first redundancy fuse cell RFC when the first synthesis word line selection signal SG_S1 and the second synthesis fuse access signal PG_S2 are activated in the first mode.

The programming circuit 609 may output the fuse data FZD from the fuse cells based on the synthesis word line selection signal SG_S and the synthesis fuse access signal PG_S in the second mode that is executed based on the second internal command BTU. The programming circuit 609 may output the fuse data FZD, which are stored in the first main fuse cell FC, when the first synthesis word line selection signal SG_S1 and the first synthesis fuse access signal PG_S1 are activated in the second mode. The programming circuit 609 may output the fuse data FZD, which are stored in the first redundancy fuse cell RFC, when the first synthesis word line selection signal SG_S1 and the second synthesis fuse access signal PG_S2 are activated in the second mode.

The access signal driver 611 may drive the synthesis fuse access signal PG_S based on the first internal command RUP and the second internal command BTU. The access signal driver 611 may be realized to perform the same operation as the access signal driver 511 illustrated in FIG. 13. Thus, detailed descriptions of the access signal driver 611 will be omitted hereinafter.

The selection signal driver 613 may drive the synthesis word line selection signal SG_S to a third voltage. The selection signal driver 613 may be realized to perform the same operation as the selection signal driver 413 illustrated in FIG. 10. Thus, detailed descriptions of the selection signal driver 613 will be omitted hereinafter.

The fuse cell array 615 may include a plurality of fuse cells. The plurality of fuse cells may include a plurality of main fuse cells FC and a plurality of redundancy fuse cells RFC. The main fuse cells FC and the redundancy fuse cells RFC may store or output the fuse data FZD based on the driven synthesis fuse access signal PG_S and the driven synthesis word line selection signal SG_S. The operation of the programming circuit 309 will be described in more detail with reference to FIG. 18 later.

The fuse data storage circuit 617 may store the fuse data FZD.

FIG. 17 is a table illustrating an operation of the row control circuit 605 included in the electronic device 600 illustrated in FIG. 16. Referring to FIG. 17, the first mode, the second mode, and a target fuse cell indicated in the present embodiment may be defined to have substantially the same meanings as the first mode, the second mode, and the target fuse cell described with reference to FIG. 11. Thus, detailed descriptions of the first mode, the second mode, and the target fuse cell indicated in the present embodiment will be omitted hereinafter.

The row control circuit 605 may generate the first synthesis fuse access signal PG_S1 and the first synthesis word line selection signal SG_S1 which are activated to have a logic "high(H)" level when the redundancy signal REDUN is inactivated and a logic level combination of the row address RADD<1:3> designates a main fuse cell FC11 in the first mode. The first synthesis fuse access signal PG_S1 may be activated to store the fuse data (FZD of FIG. 16) in a main fuse cell FCZ1 and the main fuse cell FC11 in the first mode. The first synthesis word line selection signal SG_S1 may be activated to enable the main fuse cell FC11 and a redundancy fuse cell RFC11. Thus, the fuse data (FZD of FIG. 16) may be stored in the main fuse cell FC11 when the redundancy signal REDUN is inactivated and a logic level combination of the row address RADD<1:3> designates the main fuse cell FC11 in the first mode.

The row control circuit 605 may generate the first synthesis fuse access signal PG_S1, the second synthesis fuse access signal PG_S2, and the first synthesis word line selection signal SG_S1 which are activated to have a logic "high(H)" level when the redundancy signal REDUN is inactivated and a logic level combination of the row address RADD<1:3> designates the main fuse cell FC11 in the second mode. The first synthesis fuse access signal PG_S1 may be activated to output the fuse data (FZD of FIG. 16), which are stored in the main fuse cell FCZ1 and the main fuse cell FC11, in the second mode. The second synthesis fuse access signal PG_S2 may be activated to output the fuse data (FZD of FIG. 16), which are stored in the redundancy fuse cell RFC11 and a redundancy fuse cell RFC21, in the second mode. Thus, the fuse data (FZD of FIG. 16) may be outputted from the main fuse cells FC11 and the redundancy fuse cell RFC11 when the redundancy signal REDUN is inactivated and a logic level combination of the row address RADD<1:3> designates the main fuse cell FC11 in the second mode.

The row control circuit 605 may generate the second synthesis fuse access signal PG_S2 and the first synthesis word line selection signal SG_S1 which are activated to have a logic "high(H)" level when the redundancy signal REDUN is activated and a logic level combination of the row address RADD<1:3> designates the main fuse cell FC11 in the first mode. The second synthesis fuse access signal PG_S2 may be activated to store the fuse data (FZD of FIG. 16) in the redundancy fuse cell RFC11 and the redundancy fuse cell RFC21 in the first mode. Thus, the fuse data (FZD of FIG. 16) may be stored in the redundancy fuse cell RFC11 when the redundancy signal REDUN is activated and a logic level combination of the row address RADD<1:3> designates the main fuse cell FC11 in the first mode.

The row control circuit 605 may generate the first synthesis fuse access signal PG_S1, the second synthesis fuse access signal PG_S2, and the first synthesis word line selection signal SG_S1 which are activated to have a logic "high(H)" level when the redundancy signal REDUN is activated and a logic level combination of the row address RADD<1:3> designates the main fuse cell FC11 in the second mode. Thus, the fuse data (FZD of FIG. 16) may be outputted from the main fuse cell FC11 and the redundancy fuse cell RFC11 when the redundancy signal REDUN is activated and a logic level combination of the row address RADD<1:3> designates the main fuse cell FC11 in the second mode.

FIG. 18 illustrates an example of the programming circuit 609 included in the electronic device 600 illustrated in FIG. 16. As illustrated in FIG. 18, the programming circuit 609 may include a plurality of access signal drivers (PG DRV) 611_1~611_4, a plurality of selection signal drivers (SG DRV) 613_Z and 613_1~613_4, the fuse cell array 615, a plurality of main word lines WL_Z and WL_1~WL_3, a plurality of redundancy word lines RWL_1~RWL_4, a plurality of main program lines PL_Z and PL_1~PL_3, a plurality of redundancy program lines RPL_1~RPL_4, and a plurality of bit lines BL_1-BL_M.

The access signal driver 611_1 may drive the first synthesis fuse access signal PG_S1 based on the first internal command RUP and the second internal command BTU. The access signal driver 611_1 may be realized to perform the same operation as the access signal driver 511_1 illustrated in FIG. 15. Thus, detailed descriptions of the access signal driver 611_1 will be omitted hereinafter.

The access signal driver 611_2 may drive the second synthesis fuse access signal PG_S2 based on the first internal command RUP and the second internal command BTU. The access signal driver 611_2 may be realized to perform the same operation as the access signal driver 511_2 illustrated in FIG. 15. Thus, detailed descriptions of the access signal driver 611_2 will be omitted hereinafter.

The selection signal driver 613_1 may drive the first synthesis word line selection signal SG_S1 to the third voltage. The selection signal driver 613_1 may output the first synthesis word line selection signal SG_S1, which is driven by the selection signal driver 613_1, to the main word lines WL_1 and the redundancy word line RWL_1.

The fuse cell array 615 may include the plurality of main fuse cells FC and the plurality of redundancy fuse cells RFC. Each of the main fuse cells FC illustrated in the present embodiment may have the same configuration as the main fuse cell FC described with reference to FIG. 12, and each of the redundancy fuse cells RFC illustrated in the present embodiment may have the same configuration as the redundancy fuse cell RFC described with reference to FIG. 12. Thus, detailed configurations of the main fuse cells FC and the redundancy fuse cells RFC illustrated in the present embodiment will be omitted hereinafter.

The main fuse cell FC11 may include a first fuse transistor FTR and a first selection transistor STR. The first fuse transistor FTR of the main fuse cell FC11 may store or output the fuse data (FZD of FIG. 16) based on the first synthesis fuse access signal PG_S1 which is driven by the access signal driver 611_1. The first selection transistor STR of the main fuse cell FC11 may be turned on based on the first synthesis word line selection signal SG_S1 which is driven by the selection signal driver 613_1. The first fuse transistor FTR and the first selection transistor STR of the main fuse cell FC11 may be coupled in series. The first selection transistor STR of the main fuse cell FC11 may be turned on when the bit line BL_1 is activated and the first synthesis word line selection signal SG_S1, which is driven to have the third voltage, is inputted to a gate terminal of the first selection transistor STR through the word line WL_1. The first fuse transistor FTR of the main fuse cell FC11 may store the fuse data (FZD of FIG. 16) when the first selection transistor STR is turned on and the first synthesis fuse access signal PG_S1, which is driven to have the first voltage, is inputted to a gate terminal of the first fuse transistor FTR through the program line PL_1 in the first mode. The first fuse transistor FTR of the main fuse cell FC11 may be programmed to store the fuse data (FZD of FIG. 16) by rupturing a gate dielectric layer of the first fuse transistor FTR by applying the first synthesis fuse access signal PG_S1, which is driven to have the first voltage, to the gate terminal of the first fuse transistor FTR. The first fuse transistor FTR of the main fuse cell FC11 may output the fuse data (FZD of FIG. 16) to the bit line BL_1 when the first selection transistor STR is turned on and the first synthesis fuse access signal PG_S1, which is driven to have the second voltage, is inputted to the gate terminal of the first fuse transistor FTR through the program line PL_1 in the second mode.

The redundancy fuse cell RFC11 may include a second fuse transistor FTR and a second selection transistor STR. The second fuse transistor FTR of the redundancy fuse cell RFC11 may store or output the fuse data (FZD of FIG. 16) based on the second synthesis fuse access signal PG_S2 which is driven by the access signal driver 611_2. The second selection transistor STR of the redundancy fuse cell RFC11 may be turned on based on the first synthesis word line selection signal SG_S1 which is driven by the selection signal driver 613_1. The second fuse transistor FTR and the second selection transistor STR of the redundancy fuse cell RFC11 may be coupled in series. The redundancy fuse cell RFC11 may share the bit line BL_1 with the main fuse cell FC11, and the redundancy fuse cell RFC11 and the main fuse cell FC11 may be coupled in parallel to the bit line BL_1. More specifically, the first selection transistor STR of the main fuse cell FC11 and the second selection transistor STR of the redundancy fuse cell RFC11 may be coupled in parallel to the bit line BL_1 to share the bit line BL_1 with each. The second selection transistor STR of the redundancy fuse cell RFC11 may be turned on when the bit line BL_1 is activated and the first synthesis word line selection signal SG_S1, which is driven to have the third voltage, is inputted to a gate terminal of the second selection transistor STR through the redundancy word line RWL_1. The second fuse transistor FTR of the redundancy fuse cell RFC11 may store the fuse data (FZD of FIG. 16) when the second selection transistor STR is turned on and the second synthesis fuse access signal PG_S2, which is driven to have the first voltage, is inputted to a gate terminal of the second fuse transistor FTR through the redundancy program line RPL_1 in the first mode. The second fuse transistor FTR of the redundancy fuse cell RFC11 may be programmed to store the fuse data (FZD of FIG. 16) by rupturing a gate dielectric layer of the second fuse transistor FTR by applying the second synthesis fuse access signal PG_S2, which is driven to have the first voltage, to the gate terminal of the second fuse transistor FTR. The second fuse transistor FTR of the redundancy fuse cell RFC11 may output the fuse data (FZD of FIG. 16) to the bit line BL_1 when the second selection transistor STR is turned on and the second synthesis fuse access signal PG_S2, which is driven to have the second voltage, is inputted to the gate terminal of the second fuse transistor FTR through the redundancy program line RPL_1 in the second mode.

According to the disclosed technology, two adjacent fuse cells included in an array rupture e-fuse (ARE) may be realized to share one driver for driving the two adjacent fuse cells with each other using a predetermined address decoding technique, thereby reducing an area of the ARE and resolving a bottle-neck phenomenon relating to the area reduction of the ARE.

In addition, a pair of adjacent main fuse cells and a pair of adjacent redundancy fuse cells may be alternately arrayed in a column in which a bit line is disposed, thereby improving an efficiency of the address decoding technique.

What is claimed is:
1. An electronic device comprising:
a row control circuit suitable for activating a synthesis word line selection signal for enabling a first fuse cell and a second fuse cell in a first mode and suitable for activating one of a first fuse access signal for storing fuse data in the first fuse cell or outputting the fuse data from the first fuse cell and a second fuse access signal for storing the fuse data in the second fuse cell or outputting the fuse data from the second fuse cell; and
a programming circuit configured to store the fuse data in the first fuse cell based on the synthesis word line selection signal and the first fuse access signal in the first mode or store the fuse data in second fuse cells based on the synthesis word line selection signal and the second fuse access signal in the first mode, wherein the first fuse access signal is different from the second fuse access signal.

2. The electronic device of claim 1, wherein the row control circuit is suitable for:
   activating the synthesis word line selection signal and the first fuse access signal when a row address has a logic level combination corresponding to the first fuse cell in the first mode; and
   activating the synthesis word line selection signal and the second fuse access signal when the row address has a logic level combination corresponding to the second fuse cell in the first mode.

3. The electronic device of claim 1, wherein the programming circuit is configured to:
   store the fuse data in the first fuse cell when the synthesis word line selection signal and the first fuse access signal are activated in the first mode; and
   store the fuse data in the second fuse cell when the synthesis word line selection signal and the second fuse access signal are activated in the first mode.

4. The electronic device of claim 1,
   wherein the row control circuit is suitable for activating the synthesis word line selection signal and the first and second fuse access signals in a second mode; and
   wherein the programming circuit is configured to output the fuse data, which are stored in the first and second fuse cells, based on the synthesis word line selection signal and the first and second fuse access signals in the second mode.

5. The electronic device of claim 4, wherein the row control circuit is suitable for activating the synthesis word line selection signal and the first and second fuse access signals when a row address has a logic level combination corresponding to one of the first fuse cell and the second fuse cell in the second mode.

6. The electronic device of claim 4, wherein the programming circuit is configured to:
   output the fuse data, which are stored in the first fuse cell, when the synthesis word line selection signal and the first fuse access signal are activated in the second mode; and
   output the fuse data, which are stored in the second fuse cell, when the synthesis word line selection signal and the second fuse access signal are activated in the second mode.

7. The electronic device of claim 1, wherein the programming circuit includes:
   a first access signal driver configured to drive the first fuse access signal;
   a second access signal driver configured to drive the second fuse access signal;
   a selection signal driver configured to drive the synthesis word line selection signal;
   the first fuse cell including a first fuse transistor that stores or outputs the fuse data based on the first fuse access signal driven by the first access signal driver and a first selection transistor that is turned on based on the synthesis word line selection signal driven by the selection signal driver; and
   the second fuse cell including a second fuse transistor that stores or outputs the fuse data based on the second fuse access signal driven by the second access signal driver and a second selection transistor that is turned on based on the synthesis word line selection signal driven by the selection signal driver,
   wherein the first fuse transistor and the first selection transistor are coupled in series,
   wherein the second fuse transistor and the second selection transistor are coupled in series, and
   wherein the first selection transistor and the second selection transistor are coupled in parallel to a bit line to share the bit line with each other.

8. An electronic device comprising:
   a row control circuit suitable for activating a first synthesis fuse access signal and a first word line selection signal for enabling a first fuse cell in a first mode or activating a second synthesis fuse access signal and a second word line selection signal for enabling a second fuse cell in the first mode, and activating the first synthesis fuse access signal, the first word line selection, the second synthesis fuse access signal and the second word line selection signal together for enabling the first fuse cell and the second fuse cell together in the second mode; and
   a programming circuit configured to store fuse data in the first fuse cell based on the first word line selection signal and the first synthesis fuse access signal in the first mode, or store fuse data in the second fuse cell based on the second word line selection signal and the second synthesis fuse access signal in the first mode, and output the fuse data, which are stored in the first and second fuse cells, based on the first synthesis fuse access signal, the first word line selection, the second synthesis fuse access signal and the second word line selection signal.

9. The electronic device of claim 8, wherein the row control circuit is suitable for:
   activating the first word line selection signal and the first synthesis fuse access signal when a row address has a logic level combination corresponding to the first fuse cell in the first mode; and
   activating the second word line selection signal and the second synthesis fuse access signal when the row address has a logic level combination corresponding to the second fuse cell in the first mode.

10. The electronic device of claim 9, wherein the row control circuit is suitable for:
    activating the first synthesis fuse access signal when the row address has a logic level combination corresponding to a third fuse cell in the first mode; and
    activating the second synthesis fuse access signal when the row address has a logic level combination corresponding to a fourth fuse cell in the first mode.

11. The electronic device of claim 8, wherein the row control circuit is suitable for activating the first and second word line selection signals and the first and second synthesis fuse access signals when a row address has a logic level combination corresponding to one of the first fuse cell and the second fuse cell in the second mode.

12. The electronic device of claim 8, wherein the programming circuit is configured to:
    output the fuse data, which are stored in the first fuse cell, when the first word line selection signal and the first synthesis fuse access signal are activated in the second mode; and
    output the fuse data, which are stored in the second fuse cell, when the second word line selection signal and the second synthesis fuse access signal are activated in the second mode.

13. The electronic device of claim 8, wherein the programming circuit includes:
    a first access signal driver configured to drive the first synthesis fuse access signal;

a second access signal driver configured to drive the second synthesis fuse access signal;
a first selection signal driver configured to drive the first word line selection signal;
a second selection signal driver configured to drive the second word line selection signal;
the first fuse cell including a first fuse transistor that stores or outputs the fuse data based on the first synthesis fuse access signal driven by the first access signal driver and a first selection transistor that is turned on based on the first word line selection signal driven by the first selection signal driver; and
the second fuse cell including a second fuse transistor that stores or outputs the fuse data based on the second synthesis fuse access signal driven by the second access signal driver and a second selection transistor that is turned on based on the second word line selection signal driven by the second selection signal driver,
wherein the first fuse transistor and the first selection transistor are coupled in series,
wherein the second fuse transistor and the second selection transistor are coupled in series, and
wherein the first selection transistor and the second selection transistor are coupled in parallel to a bit line to share the bit line with each other.

14. An electronic device comprising:
a row control circuit suitable for activating a synthesis word line selection signal for enabling a first fuse cell and a second fuse cell and one of a first synthesis fuse access signal and a second synthesis fuse access signal in a first mode; and
a programming circuit configured to store fuse data in the first fuse cell based on the synthesis word line selection signal and the first synthesis fuse access signal in the first mode or store fuse data in the second fuse cell based on the synthesis word line selection signal and the second synthesis fuse access signal in the first mode,
wherein the first synthesis fuse access signal is activated to store the fuse data in the first fuse cell and a third fuse cell or to output the fuse data from the first fuse cell and the third fuse cell, and
wherein the second synthesis fuse access signal is activated to store the fuse data in the second fuse cell and a fourth fuse cell or to output the fuse data from the second fuse cell and the fourth fuse cell.

15. The electronic device of claim 14, wherein the row control circuit is suitable for:
activating the synthesis word line selection signal and the first synthesis fuse access signal when a row address has a logic level combination corresponding to the first fuse cell in the first mode;
activating the synthesis word line selection signal and the second synthesis fuse access signal when the row address has a logic level combination corresponding to the second fuse cell in the first mode.

16. The electronic device of claim 15, wherein the row control circuit is suitable for:
activating the first synthesis fuse access signal when the row address has a logic level combination corresponding to the third fuse cell in the first mode; and
activating the second synthesis fuse access signal when the row address has a logic level combination corresponding to the fourth fuse cell in the first mode.

17. The electronic device of claim 14, wherein the programming circuit is configured to:
store the fuse data in the first fuse cell when the synthesis word line selection signal and the first synthesis fuse access signal are activated in the first mode; and
store the fuse data in the second fuse cell when the synthesis word line selection signal and the second synthesis fuse access signal are activated in the first mode.

18. The electronic device of claim 14,
wherein the row control circuit is suitable for activating the synthesis word line selection signal and the first and second synthesis fuse access signals in a second mode; and
wherein the programming circuit is configured to output the fuse data, which are stored in the first and second fuse cells, based on the synthesis word line selection signal and the first and second synthesis fuse access signals in the second mode.

19. The electronic device of claim 18, wherein the row control circuit is suitable for activating the synthesis word line selection signal and the first and second synthesis fuse access signals when a row address has a logic level combination corresponding to one of the first fuse cell and the second fuse cell in the second mode.

20. The electronic device of claim 18, wherein the programming circuit is configured to:
output the fuse data, which are stored in the first fuse cell, when the synthesis word line selection signal and the first synthesis fuse access signal are activated in the second mode; and
output the fuse data, which are stored in the second fuse cell, when the synthesis word line selection signal and the second synthesis fuse access signal are activated in the second mode.

21. The electronic device of claim 14, wherein the programming circuit includes:
a first access signal driver configured to drive the first synthesis fuse access signal;
a second access signal driver configured to drive the second synthesis fuse access signal;
a selection signal driver configured to drive the synthesis word line selection signal;
the first fuse cell including a first fuse transistor that stores or outputs the fuse data based on the first synthesis fuse access signal driven by the first access signal driver and a first selection transistor that is turned on based on the synthesis word line selection signal driven by the selection signal driver; and
the second fuse cell including a second fuse transistor that stores or outputs the fuse data based on the second synthesis fuse access signal driven by the second access signal driver and a second selection transistor that is turned on based on the synthesis word line selection signal driven by the selection signal driver,
wherein the first fuse transistor and the first selection transistor are coupled in series,
wherein the second fuse transistor and the second selection transistor are coupled in series, and
wherein the first selection transistor and the second selection transistor are coupled in parallel to a bit line to share the bit line with each other.

22. An electronic device comprising:
a redundancy signal generation circuit suitable for generating a redundancy signal when a row address has a predetermined logic level combination in a first mode;
a row control circuit suitable for decoding the redundancy signal and the row address in the first mode to activate a synthesis word line selection signal for enabling a main fuse cell and a redundancy fuse cell and to activate one of a first fuse access signal and a second fuse access signal; and a programming circuit configured to store fuse data in the main fuse cell based on the synthesis word line selection signal and the first fuse access signal in the first mode or store fuse data in the redundancy fuse cell based on the synthesis word line selection signal and the second fuse access signal in the first mode.

23. The electronic device of claim 22, wherein the row control circuit is suitable for:

activating the synthesis word line selection signal and the first fuse access signal when the redundancy signal is inactivated and the row address has a logic level combination corresponding to the main fuse cell in the first mode; and activating the synthesis word line selection signal and the second fuse access signal when the redundancy signal is activated and the row address has a logic level combination corresponding to the main fuse cell in the first mode.

24. The electronic device of claim 22, wherein the redundancy signal generation circuit is suitable for generating the redundancy signal when the row address has the predetermined logic level combination in a second mode;

wherein the row control circuit is suitable for activating the synthesis word line selection signal and the first and second fuse access signals when the row address has a logic level combination corresponding to the main fuse cell in the second mode; and wherein the programming circuit is configured to output the fuse data, which are stored in the main fuse cell and redundancy fuse cell, based on the synthesis word line selection signal and the first and second fuse access signals in the second mode.

25. An electronic device comprising:

a redundancy signal generation circuit suitable for generating a redundancy signal when a row address has a predetermined logic level combination in a first mode;

a row control circuit suitable for decoding the redundancy signal and the row address in the first mode to activate a first synthesis fuse access signal and a first word line selection signal or to activate a second synthesis fuse access signal and a second word line selection signal; and a programming circuit configured to store fuse data in a main fuse cell based on the first word line selection signal and the first synthesis fuse access signal in the first mode or store fuse data in a redundancy fuse cell based on the second word line selection signal and the second synthesis fuse access signal in the first mode, wherein the first synthesis fuse access signal is activated to store the fuse data in the main fuse cell and a first fuse cell or to output the fuse data from the main fuse cell and the first fuse cell, and wherein the second synthesis fuse access signal is activated to store the fuse data in the redundancy fuse cell and a second fuse cell or to output the fuse data from the redundancy fuse cell and the second fuse cell.

26. The electronic device of claim 25, wherein the row control circuit is suitable for:

activating the first word line selection signal and the first synthesis fuse access signal when the redundancy signal is inactivated and the row address has a logic level combination corresponding to the main fuse cell in the first mode; and activating the second word line selection signal and the second synthesis fuse access signal when the redundancy signal is activated and the row address has a logic level combination corresponding to the main fuse cell in the first mode.

27. The electronic device of claim 25, wherein the redundancy signal generation circuit is suitable for generating the redundancy signal when the row address has the predetermined logic level combination in a second mode;

wherein the row control circuit is suitable for activating the first word line selection signal and the first and second synthesis fuse access signals when the row address has a logic level combination corresponding to the main fuse cell in the second mode; and wherein the programming circuit is configured to output the fuse data, which are stored in the main fuse cell and the redundancy fuse cell, based on the first word line selection signal and the first and second synthesis fuse access signals in the second mode.

28. An electronic device comprising:

a redundancy signal generation circuit suitable for generating a redundancy signal when a row address has a predetermined logic level combination in a first mode;

a row control circuit suitable for decoding the redundancy signal and the row address in the first mode to activate a synthesis word line selection signal for enabling a main fuse cell and a redundancy fuse cell and to activate one of a first synthesis fuse access signal and a second synthesis fuse access signal; and a programming circuit configured to store fuse data in the main fuse cell based on the synthesis word line selection signal and the first synthesis fuse access signal in the first mode or store fuse data in the redundancy fuse cell based on the synthesis word line selection signal and the second synthesis fuse access signal in the first mode.

29. The electronic device of claim 28, wherein the row control circuit is suitable for:

activating the synthesis word line selection signal and the first synthesis fuse access signal when the redundancy signal is inactivated and the row address has a logic level combination corresponding to the main fuse cell in the first mode; and activating the synthesis word line selection signal and the second synthesis fuse access signal when the redundancy signal is activated and the row address has a logic level combination corresponding to the main fuse cell in the first mode.

30. The electronic device of claim 28, wherein the redundancy signal generation circuit is suitable for generating the redundancy signal when the row address has the predetermined logic level combination in a second mode;

wherein the row control circuit is suitable for activating the synthesis word line selection signal and the first and second synthesis fuse access signals when the row address has a logic level combination corresponding to the main fuse cell in the second mode; and wherein the programming circuit is configured to output the fuse data, which are stored in the main fuse cell and the redundancy fuse cell, based on the synthesis word line selection signal and the first and second synthesis fuse access signals in the second mode.

* * * * *